United States Patent
Yamaguchi

(10) Patent No.: US 6,735,558 B1
(45) Date of Patent: May 11, 2004

(54) CHARACTERISTIC EXTRACTION DEVICE, CHARACTERISTIC EVALUATION DEVICE, CHARACTERISTIC EXTRACTION METHOD, CHARACTERISTIC EVALUATION METHOD, RECORDING MEDIUM AND SEMICONDUCTOR DEVICE

(75) Inventor: Kenji Yamaguchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/487,826

(22) Filed: Jan. 20, 2000

(30) Foreign Application Priority Data

Jul. 19, 1999 (JP) ............................ 11-204562

(51) Int. Cl.$^7$ .............................. G06F 17/50
(52) U.S. Cl. ............... 703/14; 703/13; 703/2; 324/769
(58) Field of Search ................ 703/2, 13, 14; 324/769

(56) References Cited

U.S. PATENT DOCUMENTS

| | | | | |
|---|---|---|---|---|
| 5,021,843 | A | * 6/1991 | Ohmi | 257/379 |
| 5,467,291 | A | * 11/1995 | Fan et al. | 703/14 |
| 5,886,906 | A | * 3/1999 | Tatsumi et al. | 703/14 |
| 5,966,527 | A | * 10/1999 | Krivokapic et al. | 703/14 |
| 6,289,296 | B1 | * 9/2001 | Umeno | 703/2 |
| 6,304,836 | B1 | * 10/2001 | Krivokapic et al. | 703/14 |
| 6,314,390 | B1 | * 11/2001 | Bittner et al. | 703/14 |

OTHER PUBLICATIONS

Wong, H.; Poon, M.C. "Approximation of the length of velocity saturation region in MOSFET's" IEEE Transactions on Electron Devices, vol.: 44 Issue: 11, Nov. 1997, pp.: 2033–2036.*

Ghandhi, VLSI Fabrication Principles Silicon and Gallium Arsenide, Second Edition, John Wiley & Sons, 1994., pp. 433–437.*

Pierret, Field Effect Devices, vol. IV Second Edition, Addison Wesley Publishing Co. 1990. pp. 70–86.*

Taur et al., Fundamentals of Modern VLSI Devices, Cambridge University Press, 1998. pp. 112–161.*

F.H. De La Moneda, et al., IEEE Electron Device Letters, vol. EDL–3, No. 1, pp. 10–12, "Measurement of MOSFET Constants," Jan. 1982.*

U.S. patent application Ser. No. 09/238,887, filed Jan. 28, pending.

U.S. patent application Ser. No. 09/249,139, filed Feb. 12, pending.

U.S. patent application Ser. No. 09/487,826, filed Jan. 20, pending.

* cited by examiner

*Primary Examiner*—Kevin J. Teska
*Assistant Examiner*—Herng-der Day
(74) *Attorney, Agent, or Firm*—Oblon, Spivak, McClelland, Maier & Neustadt, P.C.

(57) ABSTRACT

As to at least two transistors different only in channel lengths from each other, Ids–Vgs characteristics in a linear region are measured under two drain-to-source voltages Vds. Consequently, a graph of Rtot=Vds/Ids vs. channel lengths is obtained for two Vds, whereby an effective channel length Leff for each Vds is extracted. A velocity saturation coefficient U1 is obtained by expressing the relation between two effective channel lengths Le1 and Le2 corresponding to the two Vds on the graph and dividing the value of Le2 at Le1=0 by the difference ΔVds between the two Vds. Thus, parameters related to mobility and a velocity saturation effect are extracted with consistency in a form matching with remaining E-T data.

6 Claims, 19 Drawing Sheets

F I G . 23
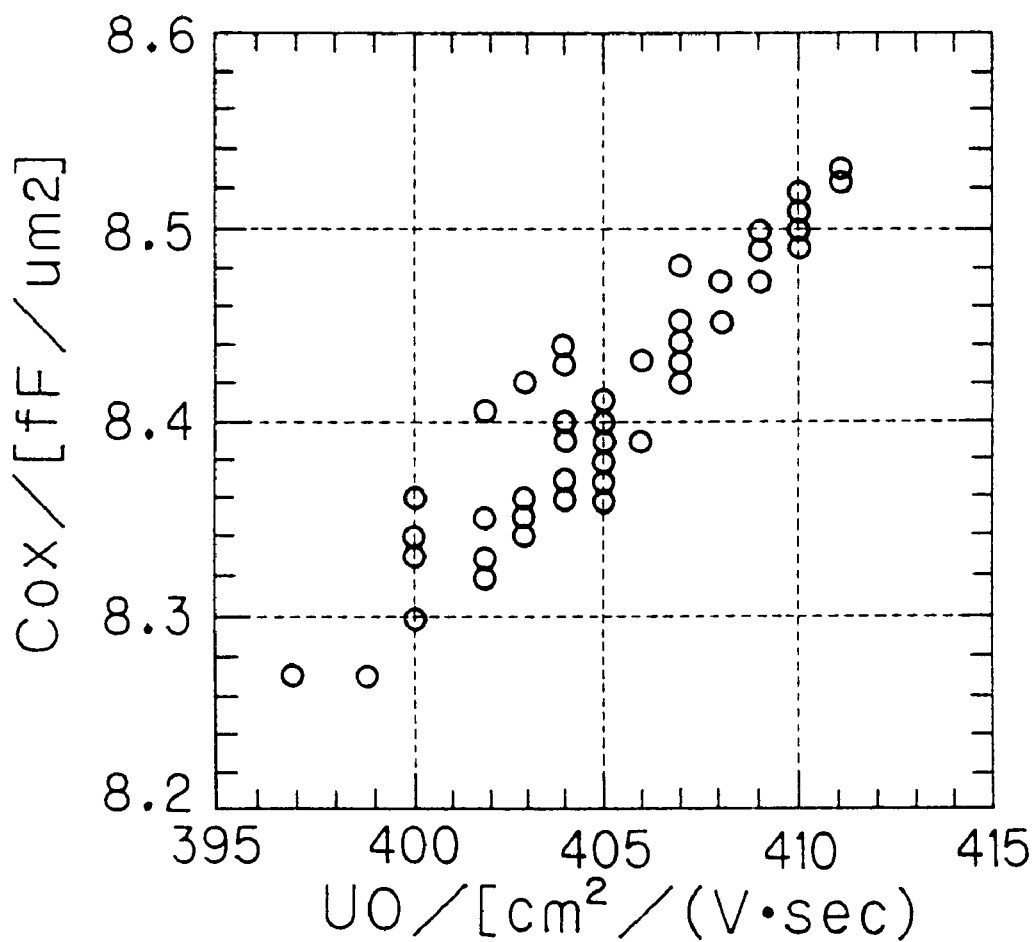

CHARACTERISTIC EXTRACTION DEVICE, CHARACTERISTIC EVALUATION DEVICE, CHARACTERISTIC EXTRACTION METHOD, CHARACTERISTIC EVALUATION METHOD, RECORDING MEDIUM AND SEMICONDUCTOR DEVICE

BACKGROUND OF THE INVENTION

1. Field of the Invention

The present invention relates to a characteristic extraction technique, a characteristic evaluation technique, a recording medium and a semiconductor device.

2. Description of the Background Art

In the process of developing a logic device, circuit simulation is widely employed for estimating the optimum margins on circuit characteristics. FIG. 31 is an explanatory diagram showing the outline of circuit simulation. A device referred to as a circuit simulator is employed for executing the circuit simulation. Data related to the characteristics of each element forming the circuit (device) to be simulated and data (referred to as "circuit connection information") related to connection conditions for each element are input in the circuit simulator. The circuit simulator executes simulation on the basis of the input data, and outputs data related to the characteristics of the circuit. On the basis of the output data, an operator can determine whether or not the circuit operates with the optimum margins and feed back the results of the determination to development of the device.

In development of the state-of-the-art logic device, circuit simulation based on the well-known SPICE model forming the world standard is generally employed in particular. Further, modeling not only employing typical values as the characteristics of the element but also adopting dispersion of the characteristics of the element from the best to the worst values in consideration of errors (process errors) occurring in the process of manufacturing the device, i.e., worst/best modeling is performed. In the worst/best modeling employing SPICE, a method based on E-T (electrical test) data forms the main stream.

In this method, a group of parameters referred to as E-T data are input as the data related to the characteristics of the element. Circuit simulation is executed after the input E-T data are converted to a group of parameters referred to as SPICE parameters necessary for executing simulation based on the SPICE model. The E-T data, which are parameters associable with the SPICE parameters and having physical meanings, can advantageously be directly extracted from the electric characteristics of the element in a short time.

If the element is a MOSFET (MOS field-effect transistor), a threshold voltage Vth, channel shortening DL, external resistance Rds, channel narrowing DW, mobility $\mu$ and a saturation velocity Vsat (or a parameter expressing a velocity saturation effect in place of Vsat) are extracted as the E-T data. FIG. 32 is a sectional view of a MOSFET for illustrating the physical meanings of these parameters. The channel shortening DL is defined as the difference between a channel length (mask length) Lm as the dimension of a mask and an electrically effective channel length (effective channel length) Leff. That is, $$DL = Lm - Leff \tag{e1}$$

While not shown in FIG. 32, the channel narrowing DW is similarly defined as the difference between a channel width (mask width) Wm as the dimension of the mask and an electrically effective channel width (effective channel width) Weff. That is, $$DW = Wm - Weff \tag{e2}$$

Total resistance between a source electrode SS and a drain electrode DD is given by the sum of resistance (channel resistance) Rch of a channel region Ch and the external resistance Rds. Both of the source electrode SS and the drain electrode DD include electrode wires. The external resistance Rds is a resistance component outside the channel region Ch, and generally includes resistance (source/drain resistance) of a source region S and a drain region D and resistance of the electrodes (including the electrode wires). Assuming that Rtot represents the total resistance, $$Rtot = Rch + Rds \tag{e3}$$

The external resistance Rds is not important in an element having a large channel length due to large channel resistance Rch. In a refined element, however, the external resistance Rds is important due to small channel resistance Rch. In particular, resistance components of electrodes are unignorable. A gate insulator film OX having a thickness Tox is interposed between a gate electrode and a semiconductor layer.

However, a method of extracting these parameters related to the MOSFET in a mutually matching form has not been known in general. A highly precise extraction method has been devised as to the channel shortening DL and the external resistance Rds as described in Japanese Patent Application No. 10-213019 (1998) (hereinafter referred to as literature 1), for example, and a method of precisely extracting the channel narrowing DW has been devised as described in Japanese Patent Application No. 10-239148 (1998) (hereinafter referred to as literature 2), for example. In relation to the mobility $\mu$ and the saturation velocity Vsat, however, there is known no method of performing extraction in a form matching with the remaining parameters.

In relation to the mobility $\mu$, for example, the Moneda method is generally known as a typical extraction method. The Moneda method is disclosed in F. H. De La Moneda, H. N. Kothcha and M. Shatzkes, "Measurement of MOSFET Constants", IEEE Elect. Dev. Lett., EDL-3(1), pp. 10, 1982 (hereinafter referred to as literature 3). In the Moneda method, the following equation (1) is assumed as the model of the mobility $\mu$:

$$\mu = \frac{\mu 0}{1 + \theta(Vgs - Vth)} \tag{1}$$

where Vgs represents a gate-to-source voltage, $\mu 0$ represents the mobility $\mu$ at the time when the gate-to-source voltage Vgs matches with the threshold voltage Vth, and $\theta$ represents a parameter.

In this case, the total resistance Rtot is given by the following equation (2):

$$Rtot = Rds + S\left(\theta + \frac{1}{Vgs - Vth - Vds/2}\right) \tag{2}$$

where the parameter S is given by the following equation (3):

$$S = \frac{Lm - DL}{\mu 0 \cdot Cox \cdot Weff} \quad (3)$$

where the parameter Cox is the capacitance of the gate insulator film OX.

On the basis of the equation (2), the mobility $\mu$ is extracted along the following procedure:

Step 1: Drain-source current Ids vs. gate-to-source voltage Vgs characteristics (Ids–Vgs characteristics) in a linear region of a plurality of transistors (MOSFETs) different only in channel length from each other are measured.

Step 2: An Rtot–1/(Vgs–Vth–Vds/2) characteristic is plotted for each transistor as shown in FIG. 33, for performing linear fitting. Vds represents a drain-to-source voltage. In this case, slope of the straight line corresponds to S in the equation (3), and the vertical axis intercept is θ·S+Rds (=R).

Step 3: From the result in the step 1, an S–Lm characteristic is plotted as shown in FIG. 34, for performing linear fitting. In this case, slope of the straight line is $1/(\mu 0 \cdot Cox \cdot Weff)$ (=C).

Step 4: Assuming that Wm≈Weff and Cox=ϵox/Tox, $\mu 0$ is given by Tox/(C·ϵox·Wm) from the result in the step 3, where ϵox represents a factor of proportionality between the capacitance Cox and 1/Tox. An actual value may be given to Cox.

Step 5: An R–S characteristic is plotted as shown in FIG. 35 from the result in the step 1, for performing linear fitting. In this case, slope of the straight line is θ.

In the Moneda method, as hereinabove described, primary deterioration is assumed in relation to the mobility $\mu$, for extracting the channel shortening DL, the external resistance Rds and the parameters $\mu 0$ and θ related to the mobility $\mu$ at the time when the gate-to-source voltage Vgs is around the threshold voltage Vth. Hence, a secondary mobility deterioration factor or external resistance Rds having Vgs dependency cannot be extracted.

This also applies to a well-known extraction method related to the velocity saturation effect. In a conventional typical method extracting a parameter related to the saturation effect, the following equation (4) is employed:

$$\frac{1}{\beta 0} = \frac{Leff + U1 \cdot Vds}{\mu 0 \cdot Cox \cdot Weff} \quad (4)$$

where U1 represents a velocity saturation coefficient.

On the basis of the equation (4), the velocity saturation effect is extracted along the following procedure:

Step 1: Ids–Vgs characteristics in a linear region of a plurality of transistors (MOSFETs) different only in channel length from each other are measured.

Step 2: For each transistor, β is regarded as (maximum value of slope of Ids–Vds characteristics)Vds.

Step 3: A 1/β0-Leff characteristic is plotted as shown in FIG. 36, for performing linear fitting. In this case, slope of the straight line is $1/(\mu \cdot Cox \cdot Weff)$ (=A). The vertical axis intercept is $U1 \cdot Vds/\mu 0 \cdot Cox \cdot Weff$ (=B).

Step 4: The velocity saturation coefficient U1 is given by B/(A·Vds) from the result in the step 3.

However, it is said that this method is problematic in extraction precision since the velocity saturation coefficient U1 is not extracted in a form matching with the remaining E-T data but influenced by the external resistance Rds.

In the conventional extraction methods, as hereinabove described, the mobility $\mu$ and the velocity saturation effect are not extracted in a form matching with extraction of the parameters DL, Rds, DW etc., and hence deterioration of precision is disadvantageously unavoidable.

SUMMARY OF THE INVENTION

A characteristic extraction device according to a first aspect of the present invention, extracting a parameter expressing a velocity saturation effect of a MOS transistor, comprises (a) an effective channel length extraction part receiving a signal expressing measured data of a characteristic of the MOS transistor and extracting an effective channel length of the MOS transistor for at least two drain-to-source voltages on the basis of the signal, and (b) a parameter calculation part calculating the parameter on the basis of the extracted effective channel length and outputting a signal expressing its value.

In the device according to the first aspect, since the parameter expressing the velocity saturation effect is extracted on the basis of the effective channel length, the parameter is precisely extracted in a form matching with channel shortening and external resistance, which are other parameters forming E-T data.

According to a second aspect of the present invention, the parameter calculation part (b) includes (b-1) a U1 calculation part calculating a velocity saturation coefficient U1 as the parameter expressing the velocity saturation effect by regarding the effective channel length as a function Le(Vds) of the drain-to-source voltages Vds and assuming the following relation with another parameter Leff:

$$Le(Vds)=Leff+U1 \cdot Vds$$

According to the second aspect, the velocity saturation coefficient is precisely extracted as the parameter expressing the velocity saturation effect in a form matching with channel shortening and external resistance.

According to a third aspect of the present invention, at least two drain-to-source voltages are two drain-to-source voltages Vds1 and Vds2, and the U1 calculation part (b-1) includes (b-1-1) a device part expressing a set of values Le(Vds1) and Le(Vds2) of the function calculated by using the relation for the two drain-to-source voltages Vds1 and Vds2, as a data point on a graph for each of at least two MOS transistors, (b-1-2) a device part expressing a group of the data points in a straight line on the graph, and (b-1-3) a device part obtaining the velocity saturation coefficient U1 by dividing the value Le(Vds2) at the Le(Vds1) being about zero on the straight line by the difference Vds2–Vds1 between the value Vds1 and the value Vds2.

According to the third aspect, the velocity saturation coefficient, which is obtained on the basis of an intercept on a straight line expressing a set of values Leff(Vds1) and Leff(Vds2) of the function on a graph or an approximate value thereof, is readily and precisely provided.

According to a fourth aspect of the present invention, at least two drain-to-source voltages are two drain-to-source voltages Vds1 and Vds2, and the U1 calculation part (b-1) includes (b-1-1) a device part expressing a set of a ratio Le(Vds2)/Le(Vds1) and an inverse 1/Le(Vds1) obtained from values Le(Vds1) and Le(Vds2) of the function calculated by using the relation for the two drain-to-source voltages Vds1 and Vds2, as a data point on a graph for each of at least two MOS transistors, (b-1-2) a device part expressing a group of the data points in a straight line on the graph, and (b-1-3) a device part obtaining the velocity saturation coefficient U1 by dividing slope of the straight line by the difference Vds2–Vds1 between the value Vds1 and the value Vds2.

According to the fourth aspect, the velocity saturation coefficient, which is obtained on the basis of slope of the straight line expressing the set of Leff(Vds2)/Leff (Vds1) and I/Leff(Vds1) on the graph, is readily and precisely provided.

According to a fifth aspect of the present invention, the effective channel length extraction part (a) includes (a-1) a device part receiving signals expressing measured data of characteristics of at least two MOS transistors different only in channel length from each other as the signals expressing the measured data and obtaining data related to drain-to-source currents Ids vs. gate-to-source voltages Vgs under at least two drain-to-source voltages Vds as to at least two MOS transistors different only in the channel length from each other on the basis of the signals, (a-2) a device part expressing a set of total resistance defined as Vds/Ids and the channel length for each of at least two MOS transistors, each of at least two drain-to-source voltages Vds and each of at least two gate overdrives Vgt as data points on a graph, (a-3) a device part individually expressing each group of the data points having both of the drain-to-source voltage Vds and the gate overdrive Vgt in common in a straight line, and (a-4) a device part calculating the effective channel length for each of at least two drain-to-source voltages Vds from an intersection between the straight lines having different gate overdrives Vgt.

According to the fifth aspect, the effective channel length, which is calculated from the intersection between the straight lines expressing total resistance vs. channel length with different gate overdrives on the graph, is readily and precisely provided.

According to a sixth aspect of the present invention, the characteristic extraction device further comprises (c) an f extraction part receiving signals expressing measured data of characteristics of at least two MOS transistors different only in channel length from each other and extracting channel resistance f(Vgt) per unit effective channel length as a function of a gate overdrive Vgt on the basis of the signals, (d) a DW extraction part receiving signals of measured data of characteristics of at least two MOS transistors different only in channel width from each other and extracting channel narrowing DW(Vgt) as a function of the gate overdrive Vgt on the basis of the signals, (e) a $\mu$ calculation part deciding the parameter so as to fit mobility $\mu$ (Vgt) as a function of the gate overdrive Vgt expressed by the following relations employing a capacitance Cox of a gate insulator film, a drain-to-source voltage Vds and a channel width Wm:

$$\frac{1}{\mu(Vgt)} = h(Vgt) \cdot Cox \cdot \left(Vgt - \frac{Vds}{2}\right)$$

and $$h(Vgt) = f(Vgt) \cdot (Wm - DW(Vgt)), \text{ and}$$

(f) a Vsat calculation part calculating a saturation velocity given by a function of the velocity saturation coefficient U1 calculated in the U1 calculation part (b-1) and the parameter decided in the F calculation part (e) as a parameter expressing the velocity saturation effect and outputting a signal expressing the value thereof.

According to the sixth aspect, the saturation velocity is extracted as the parameter expressing the velocity saturation effect on the basis of the parameters expressing the velocity saturation coefficient and the mobility, whereby the parameter expressing the velocity saturation effect is precisely provided in a form matching with channel shortening, external resistance and channel narrowing.

The present invention is also directed to a characteristic extraction device. A characteristic extraction device according to a seventh aspect of the present invention, extracting a parameter expressing mobility of a MOS transistor, comprises (a) an f extraction part receiving signals expressing measured data of characteristics of at least two MOS transistors different only in channel length from each other and extracting channel resistance f(Vgt) per unit effective channel length as a function of a gate overdrive Vgt on the basis of the signals, (b) a DW extraction part receiving signals expressing measured data of characteristics of at least two MOS transistors different only in channel width from each other and extracting channel narrowing DW(Vgt) as a function of the gate overdrive Vgt on the basis of the signals, and (c) a $\mu$ calculation part deciding the parameter to fit mobility $\mu$(Vgt) as a function of the gate overdrive Vgt expressed by the following relations with a capacitance Cox of a gate insulator film, a drain-to-source voltage Vds and a channel width Wm and outputting a signal expressing the value thereof:

$$\frac{1}{\mu(Vgt)} = h(Vgt) \cdot Cox \cdot \left(Vgt - \frac{Vds}{2}\right)$$

and $$h(Vgt) = f(Vgt) \cdot (Wm - DW(Vgt))$$

According to the seventh aspect, the parameter expressing the mobility, which is decided on the basis of the channel resistance (hereinafter referred to as "parameter f") per unit effective channel length and channel narrowing, is precisely provided in a form matching with channel shortening, external resistance and channel narrowing.

According to an eighth aspect of the present invention, the f extraction part (a) includes (a-1) a device part obtaining data related to drain-to-source current Ids vs. gate-to-source voltage Vgs as to each of at least two MOS transistors different only in the channel length from each other, (a-2) a device part expressing a set of total resistance defined as Vds/Ids and the channel length for each of at least two MOS transistors different only in the channel length from each other and each of at least two gate overdrives Vgt as a data point on a graph, (a-3) a device part individually expressing each group of the data points having the gate overdrive Vgt in common in a straight line, and (a-4) a device part calculating channel resistance f(Vgt) per the, unit effective channel length as a function of the gate overdrives Vgt from slopes of the straight lines corresponding to at least two gate overdrives Vgt respectively.

According to the eighth aspect, the parameter f, which is calculated from slope of the straight lines expressing total resistance vs. channel length with different gate overdrives on the graph, is readily and precisely provided.

According to a ninth aspect of the present invention, the DW extraction part (b) includes (b-1) a device part obtaining data related to drain-to-source current Ids vs. gate-to-source voltage Vgs as to each of at least two MOS transistors different only in the channel width from each other, (b-2) a device part expressing a set of conductance defined as Ids/Vds or the drain-to-source current Ids itself and the channel width for each of at least two MOS transistors different only in the channel width from each other and each of at least two gate overdrives Vgt as a data point on a graph, (b-3) a device part individually expressing each group of the data points having the gate overdrives Vgt in common in a straight line, and (b-4) a device part calculating the channel narrowing DW(Vgt) as a function of the gate overdrives Vgt from intercepts of a coordinate axis, expressing the channel width, of the straight lines corresponding to at least two gate overdrives Vts respectively.

According to the ninth aspect, channel narrowing, which is calculated from the intercepts on the straight lines expressing the relation between the conductance (or drain-to-source current) and the channel width on the graph, is readily and precisely provided.

The present invention is also directed to a characteristic evaluation device. A characteristic evaluation device according to a tenth aspect of the present invention, evaluating characteristics of a circuit having a MOS transistor, includes (1) an E-T data extraction part, extracting E-T data of the MOS transistor, including (1-1) the characteristic extraction device according to any of the first to sixth aspects of the present invention and (1-2) the characteristic extraction device according to any of the seventh to ninth aspects of the present invention, (2) a principal component analysis part extracting independent variables by executing principal component analysis on the E-T data extracted in the E-T data extraction part (1), (3) a Monte Carlo calculation part supplying statistical dispersion to the E-T data by supplying statistical dispersion to at least part of the independent variables, and (4) a circuit simulator receiving a signal expressing the statistically dispersed E-T data obtained in the Monte Carlo calculation part (3) and a signal expressing circuit connection information which is information related to connection conditions between elements forming the circuit and executing circuit simulation related to the circuit.

According to the tenth aspect, circuit simulation is performed in consideration of statistical dispersion with mutually matching E-T data, whereby the characteristics of the circuit can be evaluated in high precision.

The present invention is also directed to a semiconductor device. A semiconductor device according to an eleventh aspect of the present invention is manufactured through the characteristic extraction device according to any of the first to ninth aspects of the present invention or the characteristic evaluation device according to the tenth aspect of the present invention.

The semiconductor device according to the eleventh aspect, which is manufactured through the device according to any of the first to ninth aspects, can be efficiently completed to a product having guaranteed characteristics.

A semiconductor device according to a twelfth aspect of the present invention comprises an integrated circuit, including a MOS transistor, formed on a semiconductor substrate, and at least three MOS transistors, formed on the semiconductor substrate, separated from the integrated circuit, while at least three MOS transistors include a set of MOS transistors different only in channel length as mask length from each other and a set of MOS transistors different only in channel width as mask width from each other while allowing overlapping, conditions provided by the following relations:

$$Lm_{LO} > \frac{|\Delta L|}{r}$$

$$Lm_{LO} > \frac{1}{r} \cdot \frac{|\Delta Rds|}{Rdsi} Lmi$$

$$Wm_{LO} > \frac{|\Delta W|}{r}$$

are satisfied for the set of MOS transistors different only in the channel length from each other in relation to deviation $\Delta L$ between a first transistor having the maximum channel length and a second transistor having the minimum channel length in difference between finished length and mask length related to channel length, a mask length $Lm_{LO}$ of the first transistor, deviation $\Delta W$ between the first transistor and the second transistor in channel width as finished width, a channel width $Wm_{LO}$ as a mask width of the first transistor, external resistance Rdsi of the second transistor, deviation $\Delta Rds$ between the first transistor and the second transistor in external resistance, a channel length Lmi as a mask length of the second transistor, and an allowable value r for an extraction error of channel shortening relative to an effective gate length, and conditions provided by the following relations:

$$Lm_{WI} > \frac{|\Delta L|}{r}$$

$$Wm_{WI} > \frac{|\Delta W|}{r}$$

are satisfied for the set of MOS transistors different only in the channel width from each other in relation to deviation $\Delta W$ between a first transistor having the maximum channel width and a second transistor having the minimum channel width in difference between finished width and mask width related to channel width, a mask width $Wm_{WI}$ of the first transistor, deviation $\Delta L$ between the first transistor and the second transistor in channel width as finished width, a channel length $Lm_{WI}$ as a mask length of the first transistor, and an allowable value r for an extraction error of channel narrowing relative to an effective gate width.

According to the twelfth aspect, at least three MOS transistors satisfying prescribed conditions related to channel dimensions are formed on the same semiconductor substrate independently of the integrated circuit, whereby E-T data related to MOS transistors forming the integrated circuit can be extracted with prescribed precision.

The present invention is also directed to a characteristic extraction method. A characteristic extraction method according to a thirteenth aspect of the present invention, extracting a parameter expressing a velocity saturation effect of a MOS transistor, comprises steps of (a) extracting an effective channel length for at least two drain-to-source voltages, and (b) calculating the parameter on the basis of the extracted effective channel length.

According to the thirteenth aspect, since the parameter expressing the velocity saturation effect is extracted on the basis of the effective channel length, the parameter is precisely extracted in a form matching with channel shortening and external resistance, which are other parameters forming the E-T data.

According to a fourteenth aspect of the present invention, the step (b) includes a step (b-1) of regarding the effective channel length as a function Le(Vds) of the drain-to-source voltages Vds and assuming the following relation with another parameter Leff:

$$Le(Vds)=Leff+U1 \cdot Vds$$

thereby calculating a velocity saturation coefficient U1 as the parameter expressing the velocity saturation effect.

According to the fourteenth aspect, the velocity saturation coefficient is precisely extracted as the parameter expressing the velocity saturation effect in a form matching with channel shortening and external resistance.

According to a fifteenth aspect of the present invention, the at least two drain-to-source voltages are two drain-to-source voltages Vds1 abd Vds2, and the step (b-1) includes steps of (b-1-1) expressing a set of values Le(Vds1) and Le(Vds2) of the function calculated by using the relation for the two drain-to-source voltages Vds1 and Vds2 as a data point on a graph for each of at least two MOS transistors, (b-1-2) expressing a group of the data points in a straight line on the graph, and (b-1-3) obtaining the velocity saturation coefficient U1 by dividing the value Le(Vds2) at the Le(Vds1) being about zero on the straight line by the difference Vds2−Vds1 between Vds1 and Vds2.

According to the fifteenth aspect, the velocity saturation coefficient, which is obtained on the basis of an intercept on a straight line expressing a set of values Leff (Vds1) and Leff(Vds2) of the function on a graph or an approximate value thereof, is readily and precisely provided.

According to a sixteenth aspect of the present invention, the at least two drain-to-source voltages are two drain-to-source voltages Vds1 and Vds2, and the step (b-1) includes steps of (b-1-1) expressing a set of a ratio Le(Vds2)/Le (Vds1) and an inverse 1/Le(Vds1) obtained from values Le(Vds1) and Le(Vds2) of the function calculated by using the relation for the two drain-to-source voltages Vds1 and Vds2 as data a point on a graph for each of at least two MOS transistors, (b-1-2) expressing a group of the data points in a straight line on the graph, and (b-1-3) obtaining the velocity saturation coefficient U1 by dividing slope of the straight line by the difference Vds2−Vds1 between the value Vds1 and the value Vds2.

According to the sixteenth aspect, the velocity saturation coefficient, which is obtained on the basis of slope of the straight line expressing the set of Leff(Vds1)/Leff(Vds2) and 1/Leff(Vds1) on the graph, is readily and precisely provided.

According to a seventeenth aspect of the present invention, the step (a) includes steps of (a-1) receiving data related to drain-to-source currents Ids vs. gate-to-source voltages Vgs under at least two drain-to-source voltages Vds as to at least two MOS transistors different only in channel length from each other, (a-2) expressing a set of total resistance defined as Vds/Ids and the channel length for each of at least two MOS transistors, each of at least two drain-to-source voltages Vds and each of at least two gate overdrives Vgt as data points on a graph, (a-3) individually expressing each group of the data points having both of the drain-to-source voltage Vds and the gate overdrive Vgt in common in a straight line, and (a-4) calculating the effective channel length for each of at least two drain-to-source voltages Vds from an intersection between the straight lines having the different gate overdrives Vts.

According to the seventeenth aspect, the effective channel length, which is calculated from the intersection of the straight lines expressing total resistance vs. channel length with different gate overdrives on the graph, is readily and precisely provided.

The present invention is also directed to a characteristic extraction method. A characteristic extraction method according to an eighteenth aspect of the present invention, extracting a parameter expressing mobility of a MOS transistor, comprises steps of (a) extracting channel resistance f(Vgt) per unit effective channel length as a function of a gate overdrive Vgt from at least two MOS transistors different only in channel length from each other, (b) extracting channel narrowing DW(Vgt) as a function of the gate overdrive Vgt from at least two MOS transistors different only in channel width from each other, and (c) deciding the parameter to fit mobility $\mu$(Vgt) as a function of the gate overdrive Vgt expressed by the following relations with a capacitance Cox of a gate insulator film, a drain-to-source voltage Vgs and a channel width Wm:

$$\frac{1}{\mu(Vgt)} = h(Vgt) \cdot Cox \cdot \left(Vgt - \frac{Vds}{2}\right)$$

and $$h(Vgt) = f(Vgt) \cdot (Wm - DW(Vgt)).$$

According to the eighteenth aspect, the parameter expressing the mobility, which is decided on the basis of the channel resistance (hereinafter referred to as "parameter f") per unit effective length and channel narrowing, is precisely provided in a form matching with channel shortening, external resistance and channel narrowing.

According to a nineteenth aspect of the present invention, the step (a) includes steps of (a-1) obtaining data related to drain-to-source current Ids vs. gate-to-source voltage Vgs as to each of at least two MOS transistors different only in channel length from each other, (a-2) expressing a set of total resistance defined as Vds/Ids and the channel length for each of at least two MOS transistors different only in the channel length from each other and each of at least two gate overdrives Vgt as a data point on a graph, (a-3) individually expressing each group of the data points having the gate overdrive Vgt in common in a straight line, and (a-4) calculating channel resistance f(Vgt) per the unit effective channel length as a function of the gate overdrives Vgt from slope of the straight lines corresponding to at least two gate overdrives Vgs respectively.

According to the nineteenth aspect, the parameter f, which is calculated from slope of the straight lines expressing the total resistance vs. channel lengths with different gate overdrives on the graph, is readily and precisely provided.

According to a twentieth aspect of the present invention, the step (b) includes steps of (b-1) obtaining data related to drain-to-source current Ids vs. gate-to-source voltage Vgs as to each of the at least two MOS transistors different only in channel width from each other, (b-2) expressing a set of conductance defined as Ids/Vds or drain-to-source current Ids itself and the channel width for each of at least two MOS transistors different only in the channel width from each other and each of at least two gate overdrives Vgt as a data point on a graph, (b-3) individually expressing each group of the data points having the gate overdrive Vgt in common in a straight line, and (b-4) calculating the channel narrowing DW(Vgt) as a function of the gate overdrive Vgt from intercepts of a coordinate axis, expressing the channel width, of the straight lines corresponding to at least two gate overdrives Vts respectively.

According to the twentieth aspect, channel narrowing, which is calculated from the intercepts on the straight lines expressing the relation between the conductance (or drain-to-source current) and the channel widths on the graph, is readily and precisely provided.

A characteristic extraction method according to a twenty-first aspect of the present invention, extracting a parameter expressing a velocity saturation effect of a MOS transistor, comprises steps of (A) extracting the velocity saturation coefficient U1 with the characteristic extraction method according to any of the fourteenth to sixteenth aspects of the present invention, (B) extracting the parameter expressing the mobility with the characteristic extraction method according to any of the eighteenth to twentieth aspects of the present invention, and (C) calculating a saturation velocity given by a function of the velocity saturation coefficient U1 extracted in the step (A) and the parameter extracted in the step (B) as the parameter expressing the velocity saturation effect.

According to the twenty-first aspect, the saturation velocity, extracted as the parameter expressing the velocity saturation effect on the basis of the parameters expressing the velocity saturation coefficient and the mobility, is precisely provided in a form matching with channel shortening, external resistance and channel narrowing.

According to a twenty-second aspect of the present invention, at least two MOS transistors different only in the channel length from each other are at least two MOS transistors different only in channel length as mask length from each other, and conditions provided by the following relations:

$$Lm_{LO} > \frac{|\Delta L|}{r}$$

$$Lm_{LO} > \frac{1}{r} \cdot \frac{|\Delta Rds|}{Rdsi} Lmi$$

$$Wm_{LO} > \frac{|\Delta W|}{r}$$

are satisfied in relation to deviation $\Delta L$ between a first transistor having the maximum channel length and a second transistor having the minimum channel length in difference between finished length and mask length related to channel length, a mask length $Lm_{LO}$ of the first transistor, deviation $\Delta W$ between the first transistor and the second transistor in channel width as finished width, a channel width $Wm_{LO}$ as a mask width of the first transistor, external resistance Rdsi of the second transistor, deviation $\Delta Rds$ between the first transistor and the second transistor in external resistance, a channel length Lmi as a mask length of the second transistor, and an allowable value r for an extraction error of channel shortening relative to an effective gate length.

According to the twenty-second aspect, conditions related to channel sizes are provided as to the MOS transistors subjected to extraction of E-T data, whereby extraction can be performed within a prescribed range of extraction errors.

According to a twenty-third aspect of the present invention, at least two MOS transistors different only in the channel width from each other are at least two MOS transistors different only in channel width as mask width from each other, and conditions provided by the following relations:

$$Lm_{WI} > \frac{|\Delta L|}{r}$$

$$Wm_{WI} > \frac{|\Delta W|}{r}$$

are satisfied in relation to deviation $\Delta W$ between a first transistor having the maximum channel width and a second transistor having the minimum channel width in difference between finished width and mask width related to channel width, a mask width $Wm_{WI}$ of the first transistor, deviation $\Delta L$ between the first transistor and the second transistor in channel length as finished length, a channel length $Lm_{WI}$ as a mask length of the first transistor, and an allowable value r for an extraction error of channel narrowing relative to an effective gate width.

According to the twenty-third aspect, conditions related to channel sizes are provided as to the MOS transistors subjected to extraction of E-T data, whereby extraction can be performed within a prescribed range of extraction errors.

The present invention is also directed to a characteristic evaluation method. A characteristic evaluation method according to a twenty-fourth aspect of the present invention, evaluating characteristics of a circuit having a MOS transistor, comprises steps of (1) extracting E-T data of the MOS transistor, including steps of (1-1) extracting the parameter expressing the velocity saturation effect of the MOS transistor with the characteristic extraction method according to any of the thirteenth to seventeenth aspects of the present invention, and (1-2) extracting the parameter expressing the mobility of the MOS transistor with the characteristic extraction method according to any of the eighteenth to twentieth aspects of the present invention, (2) extracting independent variables by executing principal component analysis on the E-T data extracted in the step (1), (3) supplying statistical dispersion to the E-T data by supplying statistical dispersion to at least part of the independent variables, and (4) executing circuit simulation with the statistically dispersed E-T data obtained in the step (3) and circuit connection information which is information related to connection conditions between elements forming the circuit.

According to the twenty-fourth aspect, circuit simulation is performed in consideration of statistic dispersion with mutually matching E-T data, whereby the characteristics of the circuit can be evaluated in high precision.

The present invention is also directed to a recording medium. A recording medium according to a twenty-fifth aspect of the present invention records a program, 15 readable by a computer, defining an operation of the computer, and the recording medium records a program, as the program, defining the characteristic extraction method according to any of the thirteenth to twenty-third aspects of the present invention or the characteristic evaluation method according to the twenty-fourth aspect of the present invention.

According to the twenty-fifth aspect, the recording medium records the program defining the method according to any of the thirteenth to twenty-fourth aspects, whereby the method according to any of the thirteenth to twenty-fourth aspects can be carried out by connecting the recording medium to the computer.

The present invention has been proposed in order to solve the aforementioned problems of the prior art, and an object thereof is to obtain a characteristic extraction technique and a characteristic evaluation technique extracting E-T data of a MOSFET in a mutually matching form thereby enabling highly precise characteristic evaluation, and to provide a semiconductor device manufactured through these techniques, a recording medium suitable for these techniques, and a semiconductor device enabling precise extraction of E-T data through the characteristic extraction technique and the characteristic evaluation technique.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 23 is a graph showing the correlation between Cox and U0;

DESCRIPTION OF THE PREFERRED EMBODIMENTS

1. Extraction of E-T Data

In the SPICE model, DC characteristics of a MOSFET are described in the following equation (5) or (5a) with the already described E-T data:

$$Ids = \frac{\mu \cdot Cox \cdot Weff}{Leff}\left(1 + \frac{U1 \cdot Vds'}{Leff}\right)^{-1}\left(Vgs' - Vth - \frac{Vds'}{2}\right) \cdot Vds' \quad (5)$$

$$Ids = \frac{\mu \cdot Cox \cdot Weff}{Leff}\left(1 + \frac{\mu \cdot Vds'}{2Vsat \cdot Leff}\right)^{-1} \times \left(Vgs' - Vth - \frac{Vds'}{2}\right) \cdot Vds' \quad (5a)$$

As well known in the art, versions of various stages from low order to high order are prepared for the SPICE model so that an operator can select any version in response to desired precision of characteristic evaluation. In the high-order version, the equation (5) or (5a) is corrected on the basis of two-dimensional structures of a channel region Ch such as its structures along the depth direction and the channel length direction, for performing more precise simulation. The following methods according to an embodiment of the present invention are suitable for every version.

Figure 32:
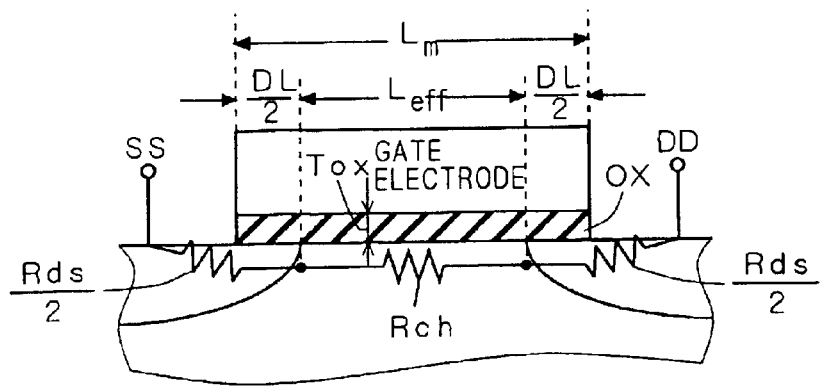
FIG. 32 is a conceptual explanatory diagram of E-T data of a MOS transistor.
Figure 33:
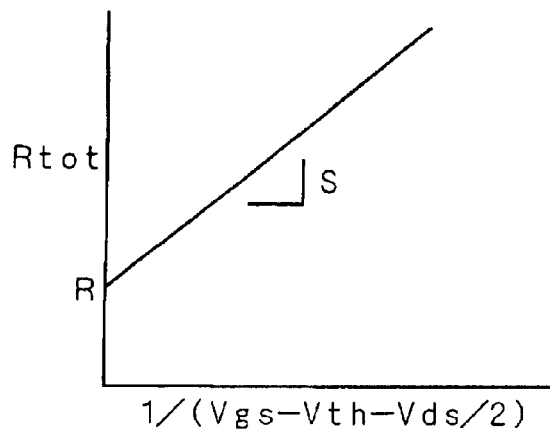
FIGS. 33 to 35 are explanatory diagrams of a conventional method of extracting $\mu$.
Figure 34:
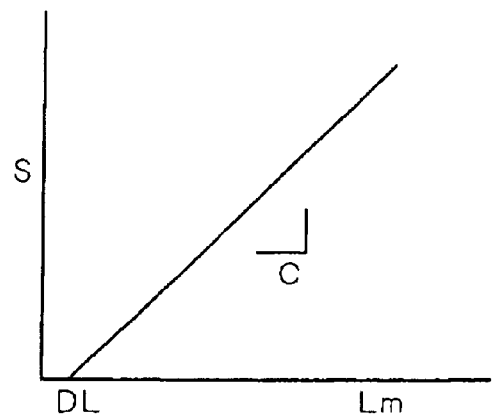
Figure 35:
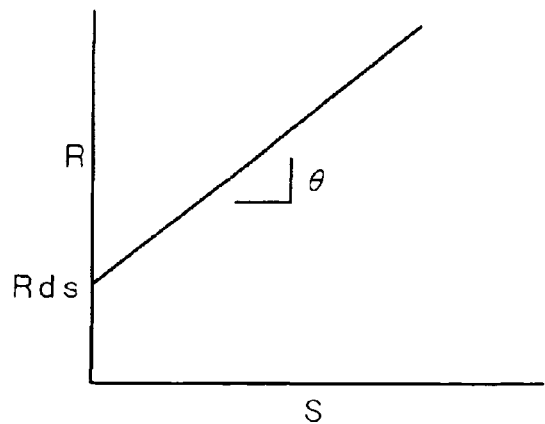
Figure 36:
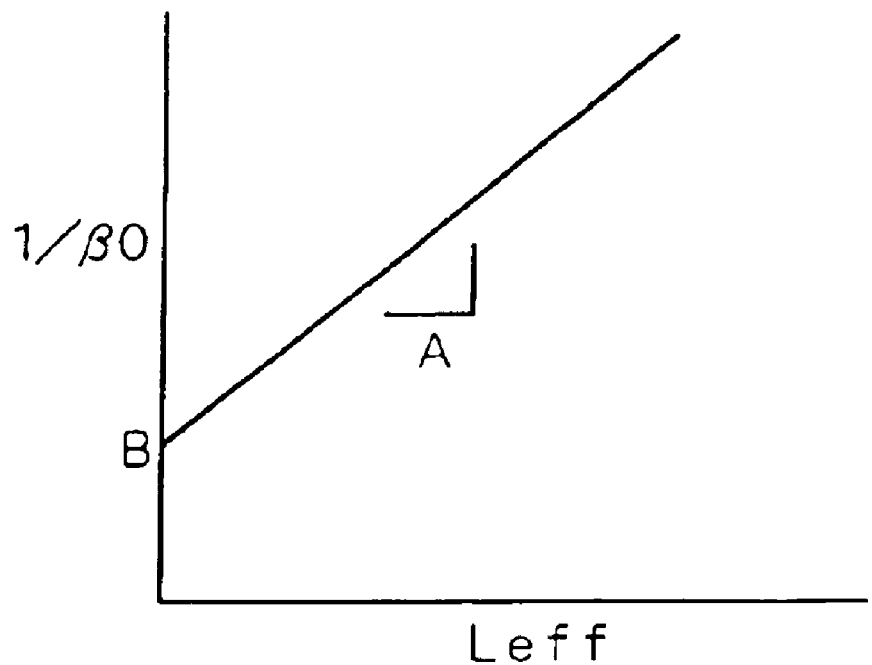
FIG. 36 is an explanatory diagram of a conventional method of extracting U1.

A velocity saturation effect is incorporated through a velocity saturation effect U1 in the equation (5), and through a saturation velocity Vsat in the equation (5a). A voltage Vds', across the channel region Ch in FIG. 32, is equal to a value obtained by subtracting a voltage drop generated across the external resistance Rds from the drain-to-source voltage Vds. A voltage Vgs' is equal to a value obtained by subtracting a voltage drop generated across source resistance Rds/2 from the gate-to-source voltage Vgs. Therefore, circuit simulation is executed also in consideration of the external resistance Rds, in addition to the equation (5) or (5a). The capacitance Cox is given by, for example:

$$Cox = \epsilon cox / Tox \quad (e4)$$

Therefore, mobility $\mu$, the capacitance Cox (or Tox), channel shortening DL, channel narrowing DW, a threshold voltage Vth, the velocity saturation coefficient U1 (or a saturation velocity Vsat) and the external resistance Rds are preferably extracted as the E-T data of the MOSFET.

Figure 1:
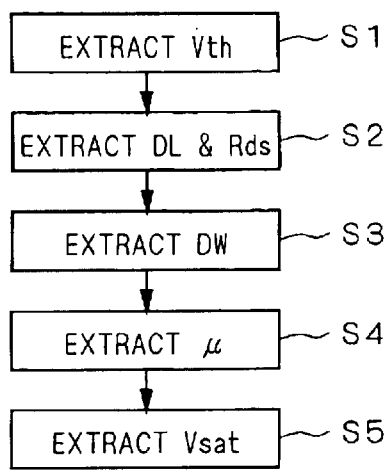
FIG. 1 is a flow chart of an E-T data extraction procedure according to an embodiment of the present invention.

FIG. 1 is a flow chart showing the procedure of extracting the E-T data according to the embodiment of the present invention. Extraction of the E-T data is sequentially executed by extracting the threshold voltage Vth (step S1), extracting the channel shortening DL and the external resistance Rds (step S2), extracting the channel narrowing DW (step S3), extracting the mobility $\mu$ (step S4) and extracting the velocity saturation effect (e.g., the saturation velocity Vsat) (step S5), for example.

Figure 2:
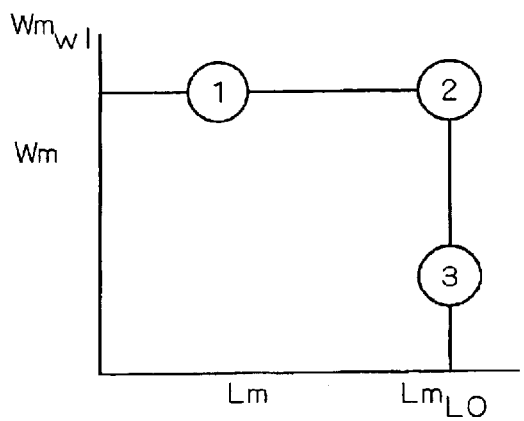
FIG. 2 is an explanatory diagram of transistors subjected to extraction according to the embodiment.

In the procedure shown in FIG. 1, $\mu$, DL, DW, the velocity saturation effect and Rds are extracted on the basis of Ids–Vgs characteristics in a linear region of at least three transistors (MOSFETs). As shown in FIG. 2, at least three transistors include at least two transistors different only in channel length (e.g., mask length) from each other and at least two transistors different only in channel width (e.g., mask width) from each other. FIG. 2 illustrates two transistors 1 and 2 having a common mask width Wm and different mask lengths Lm and two transistors 2 and 3 having a common mask length Lm and different mask widths Wm. In other words, FIG. 2 illustrates the minimum set of transistors. Referring to FIG. 2, the subscript "WI" expresses data related to the transistor having the maximum channel width, and the subscript "LO" expresses data related to the transistor having the maximum channel length.

Two sweep data (data indicating the relation of Ids–Vgs obtained when sweeping Vgs) with different drain-to-source voltages Vds are employed as the Ids–Vgs characteristics.

Thus, according to the embodiment, all E-T data including the mobility $\mu$ and the velocity saturation effect are extracted in a mutually matching form. Therefore, the E-T data can be extracted in high precision. The methods of extraction in the respective steps of FIG. 1 are now described. As for the steps S1 to S3 among these steps, well-known methods are employable. In particular, the method recorded in literature 1 and that described in literature 2 are particularly effective for the steps S2 and S3 respectively, in order to improve precision. On the other hand, the steps S4 and S5 are executed through methods characterizing the embodiment.

1.1. Extraction of Vth

Figure 3:
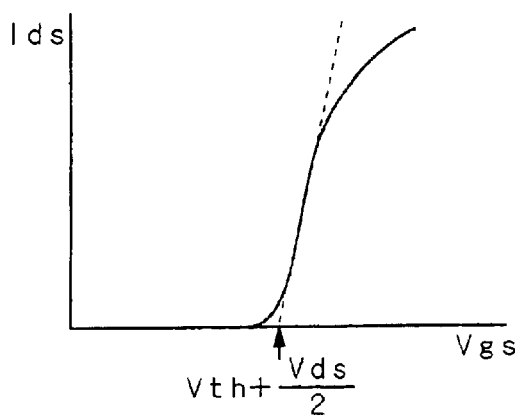
FIG. 3 is an explanatory diagram of a method of extracting Vth according to the embodiment.

The threshold voltage Vth is extracted by a well-know extrapolation method or low current method. In the extrapolation method, Ids–Vgs characteristics under a constant drain-to-source voltage Vds are measured as shown in a graph of FIG. 3. A low value such as 0.05 V, for example, is selected as the drain-to-source voltage Vds. A part having the maximum slope on an obtained curve is linearly extrapolated thereby obtaining Vth+Vds/2 as a transverse intercept. This is based on that the drain-to-source current Ids is proportionate to (Vgs−Vth−Vds/2) when the gate-to-source voltage Vgs is approximate to Vth+Vds/2, as shown in the equation (5) or (5a). The drain-to-source voltage Vds is known and hence the threshold voltage Vth is obtained as a result.

Figure 4:
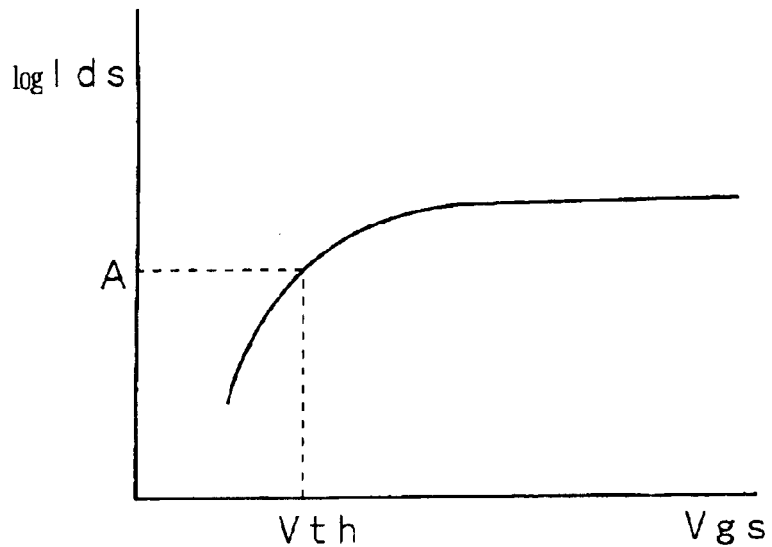
FIG. 4 is an explanatory diagram of another method of extracting Vth according to the embodiment.

Also in the low current method, Ids–Vgs characteristics under a constant drain-to-source voltage Vds are measured. A certain constant value A is empirically provided and the threshold voltage Vth is obtained as the value of the gate-to-source voltage Vgs for the constant value A, as shown in a graph of FIG. 4. The low current method is inferior in precision due to arbitrariness of setting of the constant value A, and hence the extrapolation method is more general.

1.2. Extraction of DL and Rds

The channel shortening DL and the external resistance Rds are extracted from Ids–Vgs characteristics of a linear region through at least two transistors different only in channel length from each other. The linear region corresponds to a region having a low drain-to-source voltage Vds. In other words, the Ids–Vgs characteristics are measured under a low constant drain-to-source voltage Vds in relation to at least two transistors different only in channel length from each other. The drain-to-source current Ids can be converted to total resistance Rtot through the following relation:

$$Rtot = Vds/Ids \tag{e5}$$

Figure 5:
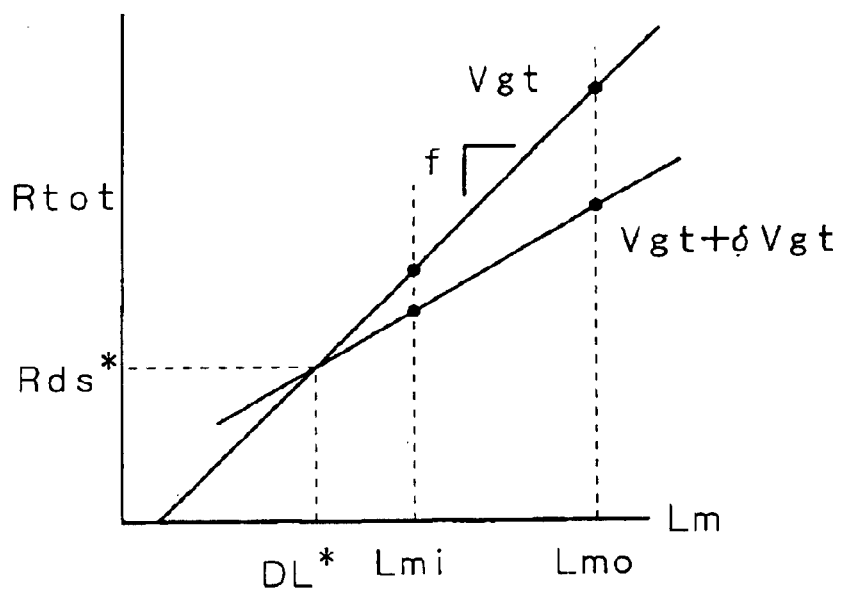
FIGS. 5 and 6 are explanatory diagrams of a method of extracting DL and Rds according to the embodiment.

Consequently, the relation Rtot–Lm can be expressed on a graph in relation to at least two transistors for two gate-to-source voltages Vgs, as shown in FIG. 5.

Referring to FIG. 5, a parameter Vgt, which is defined as follows, is referred to as a gate overdrive:

$$Vgt = Vgs - Vth \tag{e6}$$

FIG. 5 shows the relation between Rtot and Lm for two values Vgt and Vgt+δVgt in relation to two transistors i and o. Measured points of different transistors for the same Vgt are theoretically located on straight lines (linear functions). Intersections of a plurality of straight lines corresponding to different Vgt correspond to a measured value Rds* of the external resistance Rds and a measured value DL* of the channel shortening DL. Thus, Rds and DL are extracted as measured values. Lm is known and hence an effective channel length Leff is extracted through the extracted DL and the equation (e1).

With a factor f(Vgt) serving as a function of Vgt, the channel resistance Rch is expressed as follows:

$$Rch = Leff \cdot f \tag{e7}$$

The factor f expresses channel resistance per unit channel length. Hence, the following equation is obtained from the equation (e3):

$$Rtot = Leff \cdot f + Rds \tag{e8}$$

Rds is also a function of Vgt in general. From the equations (e1) and (e8), slope of the straight lines in FIG. 5 corresponds to the factor f. In this embodiment, the factor f is employed for extracting the mobility $\mu$ as described later.

In a transistor of not more than 0.25 $\mu$m in size, the extracted effective channel length Leff remarkably depends on the drain-to-source voltage Vds due to influence by a drain electric field. In order to obtain the effective channel length Leff under Vds=0, i.e., with elimination of influence by Vds, the following method is effective: Assuming that Le(Vds) represents the effective channel length Leff extracted under the given Vds, Le(Vds) is given by the following equation (6):

$$Le(Vds) = Leff + U1 \cdot Vds \tag{6}$$

Figure 6:
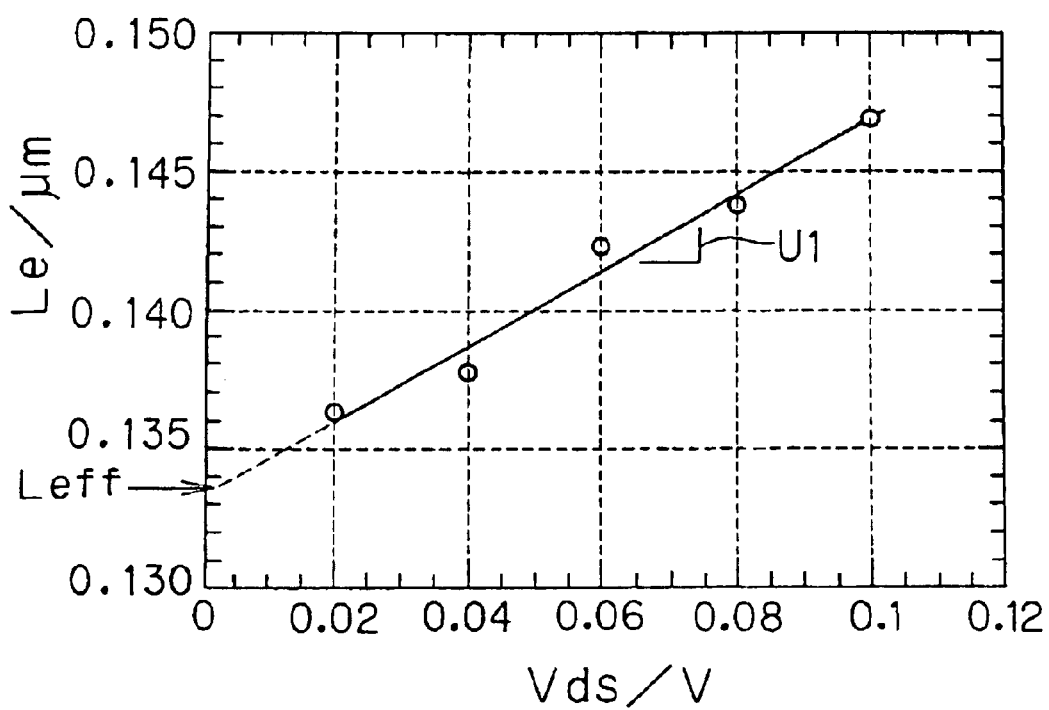

Therefore, a graph of FIG. 6 is obtained by setting the drain-to-source voltage Vds to at least two values and extracting Le(Vds) for each value. Values extracted from the equation (6) align with each other on the graph shown in FIG. 6, and hence the target effective channel length Leff is obtained as a vertical intercept by providing the straight line through the least squares method or the like. Thus, the effective channel length Leff is extracted in higher precision. As shown in the equation (6), the slope of the straight line shown in FIG. 6 corresponds to the velocity saturation coefficient U1. The value of the velocity saturation coefficient U1 is employed for extracting the velocity saturation effect, as described later.

1.3. Extraction of DW

The channel narrowing DW is extracted from Ids–Vgs characteristics of a linear region with at least two transistors different only in channel width from each other. In other words, the Ids–Vgs characteristics are measured under a constant low gate-to-source voltage in relation to at least two transistors different only in channel width from each other. The drain-to-source current Ids can be converted to conductance Gm through the following relation:

$$Gm = Ids/Vds \tag{e9}$$

Figure 7:
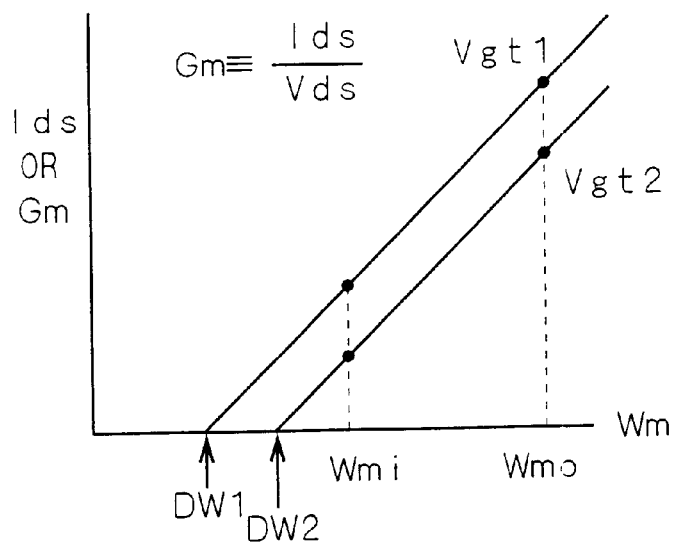
FIGS. 7 and 8 are explanatory diagrams of a method of extracting DW according to the embodiment.

Consequently, the relation Gm–Wm (or the relation Ids–Wm itself with no Gm) can be expressed on a graph in relation to at least two transistors, as shown in FIG. 7. Measured points of different transistors for the same Vgt are theoretically located on straight lines (linear functions). Transverse intercepts of the straight lines correspond to the channel narrowing DW. Thus, DW is extracted as a measured value. Wm is known and hence the effective channel width Weff is extracted through the extracted DW and the equation (e2).

The extracted channel narrowing DW is a function DW(Vgt) depending on the gate overdrive Vgt in general. In order to obtain the effective channel width Weff or the channel narrowing DW under Vgt=0, i.e., with elimination of influence by the gate overdrive Vgt, relation Gm–Wm for at least two different values of Vgt such as Vgt1 and Vgt2, for example, are preferably obtained as shown in FIG. 7. Thus, DW is extracted as the transverse intercept of each straight line. In other words, DW1 is extracted as DW for Vgt1, and DW2 is extracted as DW for Vgt2.

Figure 8:
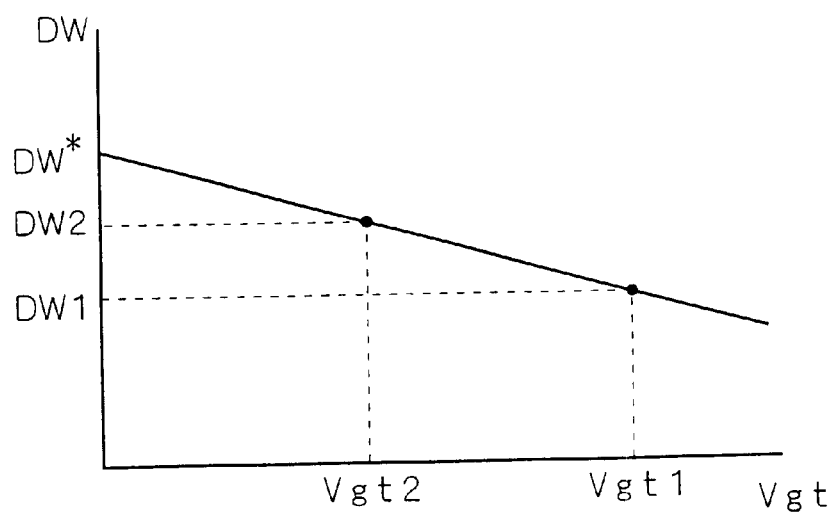

A graph shown in FIG. 8 is obtained from the relation between DW and Vgt extracted in the aforementioned manner. The target channel narrowing DW is obtained as a value DW* of a vertical intercept by approximating the relation of DW-Vgt with a straight line and providing the straight line by the least squares method or the like. The obtained DW can be converted to the effective channel width Weff from the equation (e2).

1.4. Extraction of $\mu$

Figure 9:
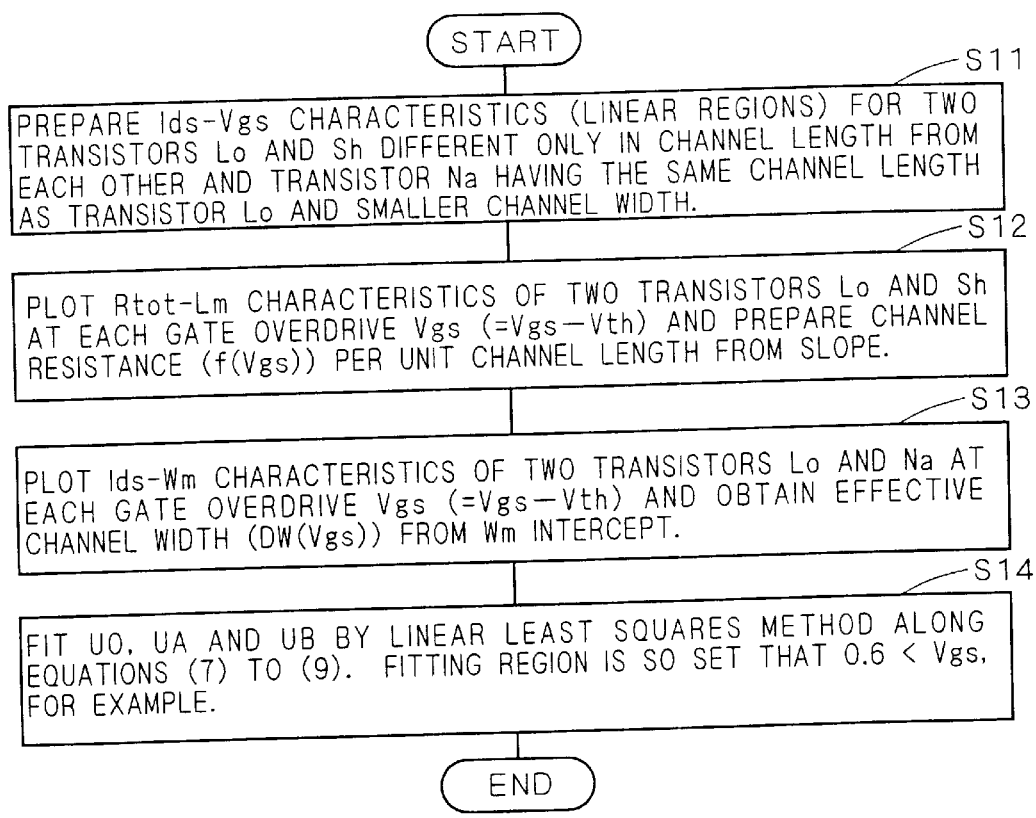
FIG. 9 is a flow chart of a method of extracting M according to the embodiment.

FIG. 9 is a flow chart showing the procedure of extracting the mobility $\mu$ according to this embodiment. In order to extract the mobility $\mu$, Ids-Vgs characteristics in a linear region are measured as to at least two transistors (e.g., a transistor Lo having a large channel length and a transistor Sh having a small channel length) different only in channel length from each other and at least two transistors (e.g., the transistor Lo and a transistor Na having a small channel width) different only in channel width from each other at a step S11. Consequently, the graph of FIG. 5 is obtained in relation to the two transistors Lo and Sh, for example. Thus, the factor f defined in the equation (e7) is extracted as the slope of the straight line (step S12). The factor f is generally expressed in a function f(vgt) of the gate overdrive Vgt. Further, the graph of FIG. 7 or 8 is obtained in relation to the two transistors Lo and Na, for example, whereby the channel narrowing DW(Vgt) is extracted as a function of the gate overdrive Vgt. Thus, the effective channel width Weff(Vgt) is obtained (step S13).

From the factor f, a factor h can be introduced through the following equation $$f = \frac{h}{W\!e\!f\!f} \quad (7)$$

Hence, the factor h is extracted from the extracted effective channel width Weff and the factor f. The factor h is generally expressed in a function h(Vgt) of the gate overdrive Vgt. From the equation (e7), further, the channel resistance Rch is expressed as follows:

$$Rch = Le\!f\!f \cdot f = h \cdot Le\!f\!f / W\!e\!f\!f \quad (e10)$$

From the equations (e10) and (5) (or (5a)), the following equation (8) is deduced:

$$\frac{1}{\mu} \approx h \cdot Cox(Vgt - Vds/2) \quad (8)$$

As the capacitance Cox, a measured value can be provided on the basis of the following equation (e11), already described in the above explanation of the Moneda method:

$$Cox = \epsilon ox / Tox \quad (e11)$$

Figure 10:
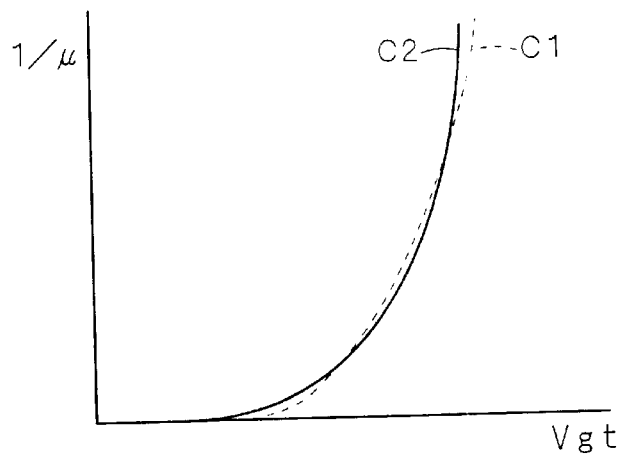
FIG. 10 is an explanatory diagram of the method of extracting $\mu$ according to the embodiment.

Consequently, relation $1/\mu$–Vgt can be expressed on a graph on the basis of the equation (8), as shown in FIG. 10. Referring to FIG. 10, a curve C1 typically shows the relation based on the equation (8).

In the SPICE model, a model describing $1/\mu$ by a power series of Vgt, for example, can be employed as the mobility, included in the equation (5) or (5a). The following equation (9) is an example expressing $1/\mu$ in the sum from zero-order to secondary exponentiation. In the equation (9), three parameters U0, UA and UB define Vgt dependency of $\mu$. The parameter U0, corresponding to the value of $\mu$ in zero-order approximation, corresponds to $\mu$ in a region having a low electric field $\epsilon y$, i.e., low electric field mobility. The parameters UA and UB, referred to as primary and secondary mobility deterioration factors, express the magnitudes of correction in primary approximation and secondary approximation respectively.

$$\mu = \frac{U0}{1 + UA(Vgt + 2Vth) + UB(Vgt + 2Vth)^2} \quad (9)$$

As shown in FIG. 10, the values of the parameters U0, UA and UB are extracted through the least squares method, for example, so that a curve C2 expressing the equation (9) most approximates to a curve C1 based on the equation (8), for example. Thus, extraction of the mobility $\mu$ is completed (step S14 in FIG. 9). It follows that $\mu$ in primary approximation is extracted when forcibly setting the parameter UB to zero in the equation (9), while $\mu$ in zero-order approximation is extracted when also setting the parameter UA to zero. The operator can arbitrarily select any approximation in response to necessary precision of characteristic evaluation.

The factor f employed in the aforementioned extraction of the mobility $\mu$ may be extracted simultaneously with the channel shortening DL and the external resistance Rds in the step S2 in place of the step S4 (FIG. 1), and the throughput is improved in this case. Similarly, the effective channel width Weff may not be extracted anew in the step S4 but the value extracted in the step S3 may be employed as such, more preferably in consideration of the throughput. A characteristic extraction device (FIG. 24) described later corresponds to this preferable form.

1.5. Extraction of Velocity Saturation Effect

Figure 11:
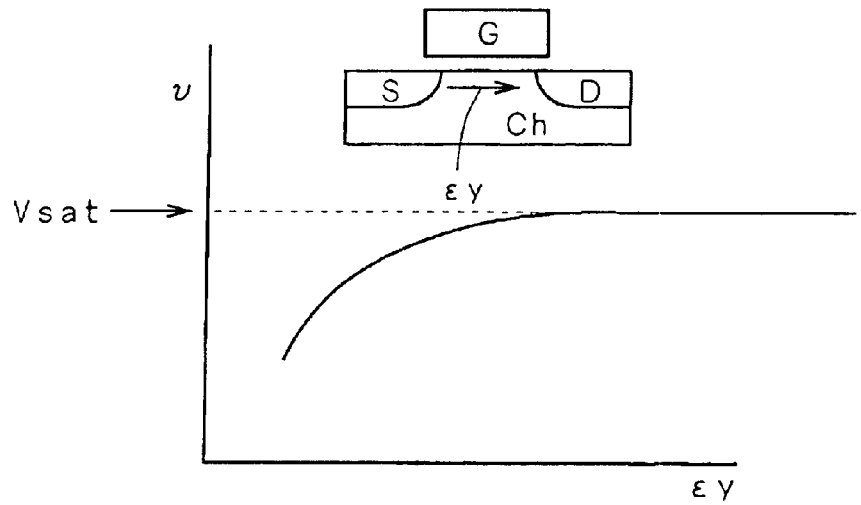
FIG. 11 is a graph illustrating the concept of a saturation velocity Vsat.

As shown in a graph in FIG. 11, a carrier velocity v is increased as the electric field $\epsilon y$ applied to the channel region Ch in the direction of the channel length is increased. The velocity v is rapidly increased with the electric field $\epsilon y$ in a region where the electric field $\epsilon y$ is relatively weak, while the velocity v exhibits a tendency toward saturation when the electric field $\epsilon y$ is strengthened beyond a certain degree. A saturation value of the velocity v is the saturation velocity Vsat. As already described, the effect of velocity saturation is reflected through the saturation velocity Vsat in the equation (5) and through the velocity saturation coefficient U1 in the equation (5a).

Figure 12:
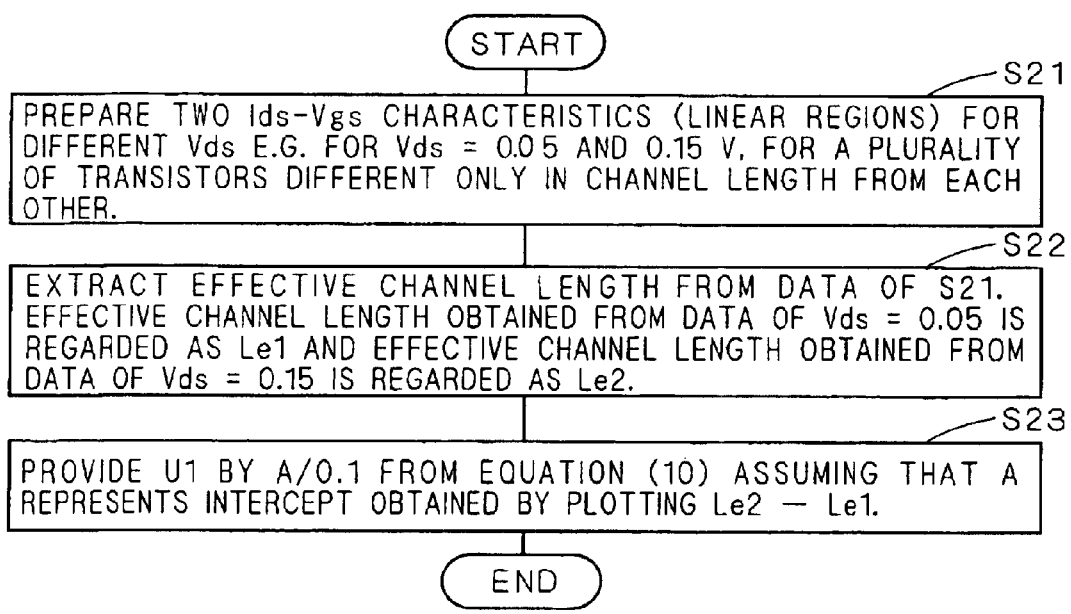
FIG. 12 is a flow chart of a method of extracting Vsat according to the embodiment.

FIG. 12 is a flow chart showing a procedure of extracting the velocity saturation coefficient U1 in this embodiment. In order to extract the velocity saturation coefficient U1, Ids-Vgs characteristics in a linear region are measured as to at least two transistors different only in channel length from each other under at least two drain-to-source voltages Vgs at a step S21. For example, Vds1=0.05 V and Vds2=0.15 V are selected as the drain-to-source voltages Vds.

Consequently, the graph of FIG. 5 is obtained for the two Vds, and the effective channel length Leff is extracted for each Vds (step S22). Assuming that Le1 and Le2 represent the effective channel lengths Leff correspond to the two values Vds1 and Vds2, the following equation (10) is deduced from the equation (6):

$$Le2 = Le1 + U1 \cdot \Delta Vds \quad (10)$$

where $\Delta Vds$ is defined as follows:

$$\Delta Vds = Vds2 - Vds1 \quad (e12)$$

Figure 13:
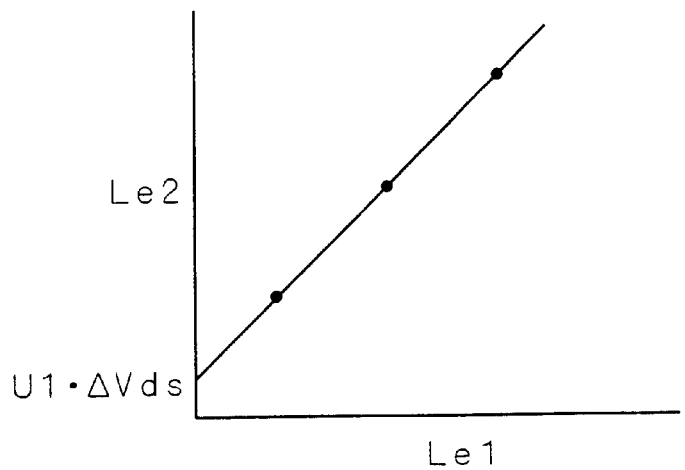
FIG. 13 is an explanatory diagram of the method of extracting Vsat according to the embodiment.

When expressing the relation Le2-Le1 on a graph, a vertical intercept corresponds to U1·ΔVds, as shown in FIG. 13. FIG. 13 illustrates data points for three transistors. Therefore, the velocity saturation coefficient U1 is extracted by dividing the vertical intercept of FIG. 13 by ΔVds (e.g., ΔVds=0.1 V) (step S23 in FIG. 12). The velocity saturation coefficient U1 may alternatively be extracted as an approximate value by dividing a value Le2 (≈vertical intercept) corresponding to Le1≈0 by ΔVds. In place of the step S23, further, the relation Le(Vds)–Vds may be expressed on a graph as shown in FIG. 6, so that the velocity saturation coefficient U1 can be directly extracted from slope of a straight line most approximate to this relation.

The following equation is obtained from the equation (10):

$$Le2/Le1=1+U1\cdot\Delta Vds/Le1 \tag{e13}$$

Hence, it is also possible to obtain the velocity saturation coefficient U1 by expressing the relation between Le2/Le1 and 1/Le1 on a graph in place of the relation Le2–Le1 and dividing slope thereof by ΔVds=0.1 V, for example.

In order to extract the saturation velocity Vsat as a parameter expressing the velocity saturation effect, the relation of the following equation (11) present between Vsat and U1 may be employed:

$$Vsat = \frac{\mu}{2 \cdot U1} \sim \frac{U0}{2 \cdot U1} \tag{11}$$

Figure 14:
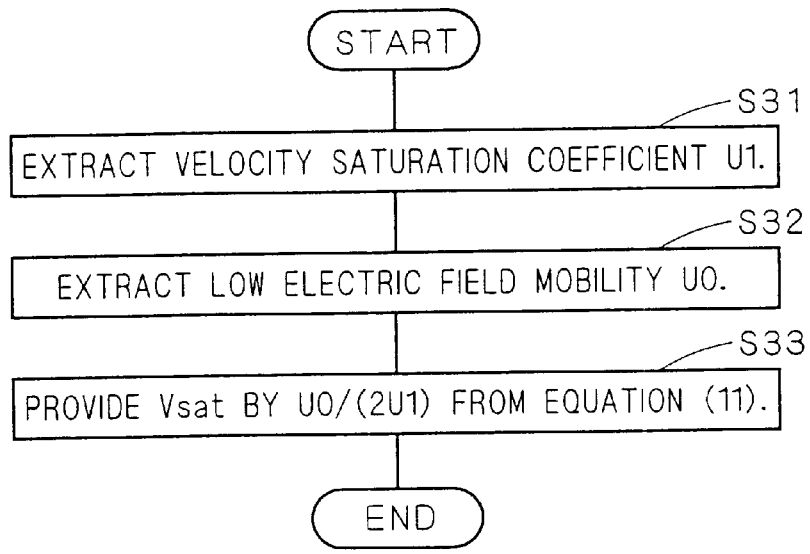
FIG. 14 is a flow chart of another method of extracting Vsat according to the embodiment.

As shown in a flow chart of FIG. 14, the velocity saturation coefficient U1 may be first extracted (step S31) along the procedure described with reference to FIG. 12, the low electric field mobility U0 is then extracted through the aforementioned process of extracting the mobility $\mu$ (step S32) and the saturation velocity Vsat is calculated on the basis of the equation (11) (step S33).

The value of the mobility $\mu$(Vgt) at a certain value of Vgt may be employed in place of the low electric field mobility U0. For example, the saturation velocity Vsat may be calculated through the value of the mobility $\mu$ at Vgt=0.5 V on the basis of the following equation:

$$Vsat=\mu(Vgt=0.5)/(2\cdot U1) \tag{e14}$$

The effective channel length Leff employed in the aforementioned extraction of the velocity saturation effect may be extracted simultaneously with the channel shortening DL and the external resistance Rds in the step S2 in place of the step S5 (FIG. 1), and the throughput is improved in this case. Similarly, the mobility $\mu$ (U0) may not be extracted anew in the step S5 but the value extracted in the step S4 may be employed as such, more preferably in consideration of the throughput. The characteristic extraction device (FIG. 24) described later corresponds to this preferable form.

2. Set of Transistors Suitable for Extraction of E-T Data

Optimum conditions for dimensions of a set (referred to as TEG) of transistors shown in FIG. 2 subjected to extraction of the E-T data are now described.

2.1. Influence of Dispersion of Difference Between Lg and Lm on Extraction of DL First, conditions for suppressing errors of DL extraction resulting from variation of difference between a finished length Lg and a mask length Lm with each transistor to a value less than an allowable value are described. The dispersion of the difference between Lg and Lm results from dispersion of process of forming gate electrodes of polysilicon or the like.

When employing the transistors i and o, the measured value DL* of the channel shortening DL is given by the following equation, as shown in FIG. 5:

$$DL^*(Vgt) = \left(Lmi - \frac{Ri'}{Ro'}Lmo\right)\left(1 - \frac{Ri'}{Ro'}\right)^{-1} \tag{12}$$

where Ri' and Ro' represent differential coefficients of the total resistance Rtot of the transistors i and o by Vgs respectively.

Assuming that DL** represents the abscissa of the intersection of the straight lines in the case of employing the finished length Lg in place of the mask length Lm, the following equation (13) is obtained:

$$DL^{**}(Vgt) = \left(Lgi - \frac{Ri'}{Ro'}Lgo\right)\left(1 - \frac{Ri'}{Ro'}\right)^{-1} \tag{13}$$

where Lgo is given by the following equation (14) with the difference ΔLo between the same and Lmo, and Lgi is given by the following equation (15) with the difference ΔLi between the same and Lmi:

$$Lgo=Lmo+\Delta Lo \tag{14}$$

$$Lgi=Lmi+\Delta Li \tag{15}$$

Employing the equations (12) to (15), the difference between DL* and DL** is given by the following equation (16):

$$DL^* - DL^{**} = -\Delta Li + \frac{Ri'}{Ro'}\left(1 - \frac{Ri'}{Ro'}\right)^{-1}\Delta L \tag{16}$$

$$\approx -\Delta Li + \frac{Ri'}{Ro'}\Delta L \text{ (for } Lmi << Lmo\text{)}$$

$$\approx -\Delta Li + \frac{Li}{Lo}\Delta L$$

where Li and Lo represent the effective gate lengths of the transistors i and o respectively. ΔL is given by the following equation (17). In other words, ΔL represents deviation of the difference between the finished length Lg and the mask length Lm between the transistors i and o.

$$\Delta L \equiv \Delta Lo - \Delta Li \tag{17}$$

The equations (15) and (16) indicate that the effective channel length of the transistor i is extracted when Lmi<<Lmo. The second term on the right of the equation (16) expresses the error. When an allowable value (referred to as "relative error") r for extraction errors of DL relative to Leff is given, therefore, the condition of the following equation (18) must be satisfied:

$$\frac{Li}{Lo} \cdot |\Delta L| < r \cdot Li \tag{18}$$

Assuming that Lo≈Lmo, the following equation (19) is obtained from the equation (18):

$$Lmo > \frac{|\Delta L|}{r} \tag{19}$$

This equation (19) limits the channel length of the transistor o. When ΔL=0.1 μm and r=0.02, for example, the condition given by the following equation (20) must be satisfied in order to precisely extract the effective channel length of the transistor i:

$$Lmo > 5\mu m \quad (20)$$

2.2. Influence of Dispersion of Channel Width on Extraction of DL

Conditions for suppressing errors of DL extraction resulting from variation of a finished channel width Wg with each transistor to a value less than an allowable value are now described. Dispersion of the channel width Wg results from dispersion of field separation in the transistors.

First, source/drain resistance is expressed by the following equation (21) as employing a factor g:

$$Ri = \frac{Li}{Wi} g + Rds \quad (21)$$

where Ri represents the total resistance Rtot of the transistor i. Difference $\Delta W$ between the finished channel widths Wg of the transistors i and o is given by the following equation (22):

$$\Delta W = Wi - Wo \quad (22)$$

With the equation (22), the equation (21) is expressed in the following equation (23):

$$Ri = \frac{Li}{Wo + \Delta W} g + Rds = \frac{Li \cdot \left(1 - \frac{\Delta W}{Wo}\right)}{Wo} g + Rds \quad (23)$$

Considering that the factor g is approximately independent of the channel width, the equation (23) expresses that the channel length Li of the transistor i is equivalently replaced with $(1-\Delta W/Wo)$ times its value. When the already described relative error r is given, the following equation (24) must be satisfied as to the error $\Delta Li$:

$$Li \cdot \frac{\Delta W}{Wo} < r \cdot Li \quad (24)$$

Assuming that $Wo \approx Wmo$ (mask width of the transistor o), the following equation (25) is obtained from the equation (24):

$$Wmo > \frac{|\Delta W|}{r} \quad (25)$$

This equation (25) limits the channel width of the transistor. If $\Delta W = 0.1 \mu m$ and r=0.02, for example, the condition given by the following equation (26) must be satisfied in order to precisely extract the effective channel length of the transistor i:

$$Wmo > 5 \mu m \quad (26)$$

2.3. Influence of Dispersion of Rds on Extraction of Rds

Conditions for suppressing errors of Rds extraction resulting from variation of the external resistance Rds with each transistor to a value less than an allowable value are now described. The dispersion of the external resistance Rds results from dispersion of the source region S, the drain region D, the source electrode (including the electrode wire) SS and the drain electrode (including the electrode wire) DD.

Figure 15:
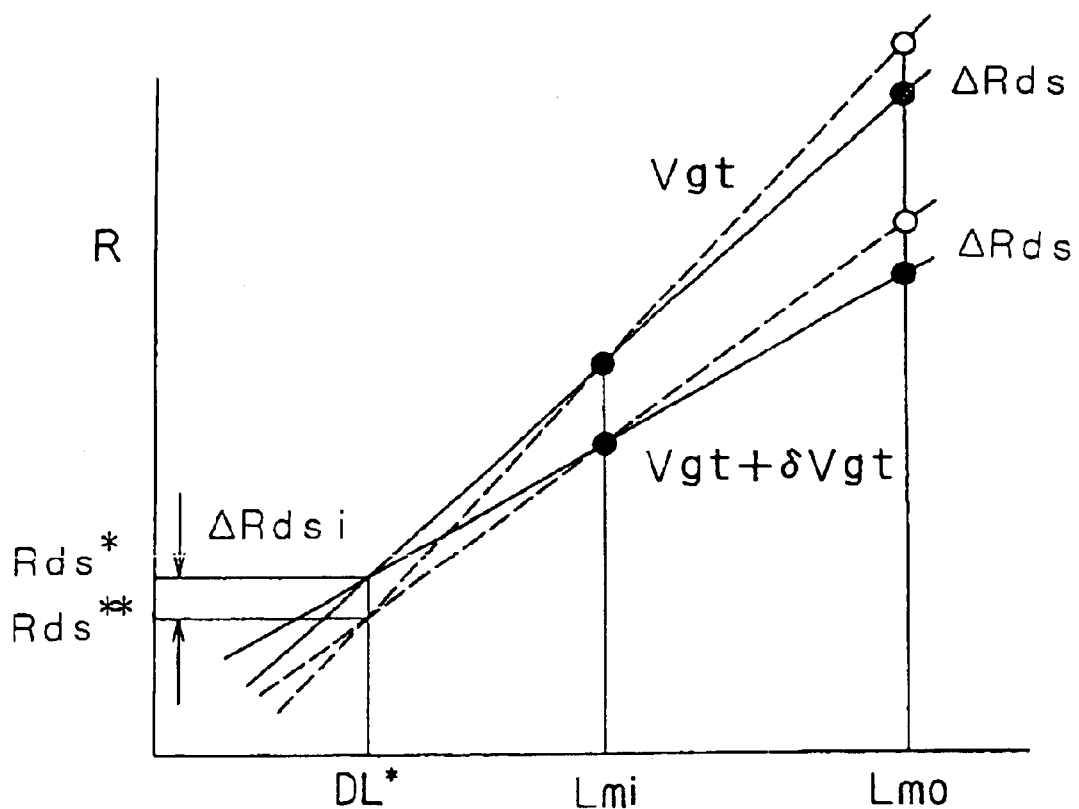
FIG. 15 is a graph illustrating an equation (27) according to the embodiment.

Assuming that Vgt dependency of the external resistance Rds is ignorable, an error $\Delta Rds$ of Rds can be expressed by the following equation (27), as understood from FIG. 15:

$$\Delta Rdsi \equiv Rds^* - Rds^{**} \approx \frac{Li}{Lo - Li} \Delta Rds \quad (27)$$

$$\approx \frac{Li}{Lo} \Delta Rds \leq \frac{Lmi}{Lmo} \Delta Rds$$

where $\Delta Rds$ is given by the following equation (28):

$$\Delta Rds = Rdsi - Rdso \quad (28)$$

When the already described relative error r is given, the condition expressed by the following equation (29) must be satisfied:

$$\frac{Lmi}{Lmo} \cdot |\Delta Rds| < r \cdot Rdsi \quad (29)$$

The following equation (30) is obtained from the equation (29):

$$Lmo > \frac{1}{r} \cdot \frac{|\Delta Rds|}{Rdsi} \cdot Lmi \quad (30)$$

This equation (30) limits the size of the transistor o. When $Lmi=0.2 \mu m$, $abs(\Delta Rds)/Rdsi=1$ and r=0.05, for example, the condition given by the following equation (31) must be satisfied in order to precisely extract the external resistance of the transistor i. Symbol abs( ) expresses an absolute value.

$$Lmo > 4 \mu m \quad (31)$$

The aforementioned conditions hold as such also when regarding the transistor o as a transistor having the maximum channel length (mask length) and extending the transistor i to a transistor having the minimum channel length (mask length) in the case of employing at least two MOS transistors different only in channel length as mask length from each other as the objects of E-T data extraction in general.

2.4. Influence on Extraction of DW

Also as to extraction errors of the channel narrowing DW, discussion similar to that on the extraction errors of the channel shortening DL holds. Therefore, conditions for suppressing extraction errors of DW to a value less than an allowable value are expressed by the following equations (32) and (33) with an allowable value (also referred to as "relative error") for extraction errors of DW relative to Weff:

$$Wmo > \frac{|\Delta W|}{r} \quad (32)$$

$$Lmo > \frac{|\Delta L|}{r} \quad (33)$$

where Wmo and Lmo represent the mask width and the mask length of the transistor having the maximum channel width (mask width) respectively. $\Delta W$ represents deviation of the difference between the finished width Wg and the mask width Wm related to the channel width between the transistors having the maximum and minimum channel widths (mask widths). $\Delta L$ represents deviation of the finished length Lg of the channel length between the transistors having the maximum and minimum channel widths (mask widths).

3. Verification Data

Data related to DC characteristics of MOSFETs obtained by executing circuit simulation based on the SPICE model with E-T data extracted on the basis of the aforementioned methods are now presented as verification data for the aforementioned methods. BSIM3V3.1 (Y. Cheng et al., "BSIM3v3 Manual (Final Version)", December 1996) was employed as the version of the SPICE model, and SPICE parameters U0, Lint, Wint, Tth0, Vsat and Rdsw were employed. These parameters define the mobility, the channel shortening DL, the channel narrowing DW, the threshold voltage Vth, the saturation velocity Vsat and the external resistance Rds respectively.

The mobility $\mu$ was extracted on the assumption that the thickness Tox of the gate insulator film OX is constant, and a technique of forcing dispersion of Tox into 1 was employed. In relation to the mobility $\mu$, the primary and secondary mobility deterioration factors UA and UB were regarded as correction terms, and only the low electric field mobility U0 was taken into consideration. In relation to the channel shortening DL and the channel narrowing DW, shape dependence effects were ignored and forced into the parameters Lint and Wint respectively.

In relation to the threshold voltage Vth, only the parameter Vth0 of the transistor having the maximum channel length and the maximum channel width was taken into consideration. This is because the parameter Vth0 corresponds to the threshold voltage Vth of a transistor having an infinite channel length and an infinite channel width. The velocity saturation coefficient U1 was taken into consideration as Vsat=U0/(2·U1) for the parameter Vsat. Bias dependency of source/drain resistance were regarded as a correction term, and taken into consideration with the parameter Rdsw.

This method reflects dispersion of extracted values of E-T data for each semiconductor chip to Lint, Wint, Vth0, U0, Rds and Vsat among parameters (typical parameters) extracted as typical values from a typical semiconductor chip (typical chip). As to the parameters Lint, Wint and Vth0, difference of the E-T data between each semiconductor chip and the typical chip was added to the typical values. As to the parameters U0, Rds and Vsat, the typical values were replaced with values given by the following equation (e15):

(value of E-T data of each chip)×(typical value of parameter)/
(value of E-T data of typical chip)         (e15)

FIGS. 16 to 19 are graphs showing data obtained by executing circuit simulation, in particular, DC characteristics related to the best semiconductor chip (best chip) and the typical chip. Each semiconductor chip is provided with an NMOS transistor (n-channel MOSTFET) having a channel width W of 21.6 $\mu$m and a channel length L of 0.18 $\mu$m.

Figure 16:
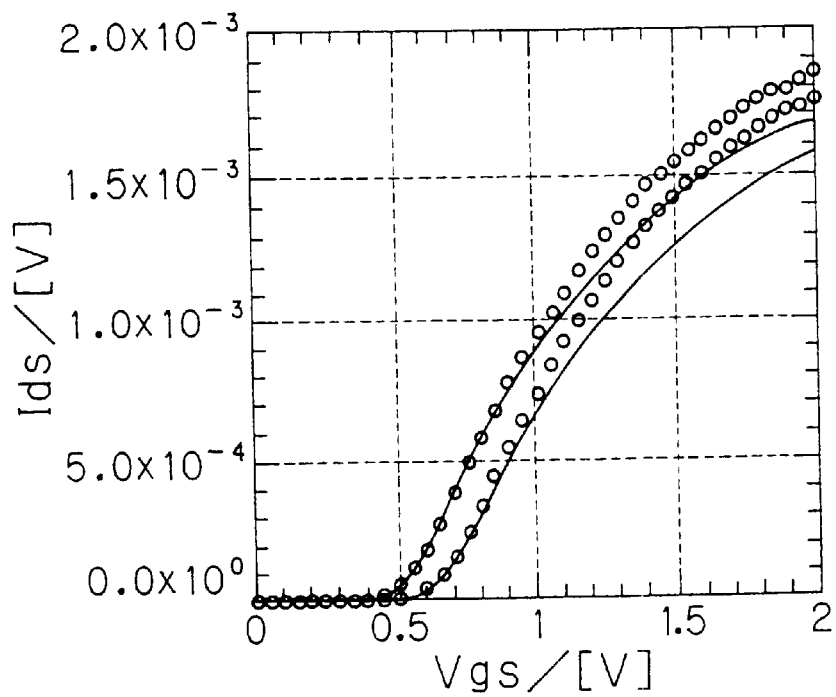
FIGS. 16 and 17 are graphs compared with the extraction methods according to the embodiment.
Figure 17:
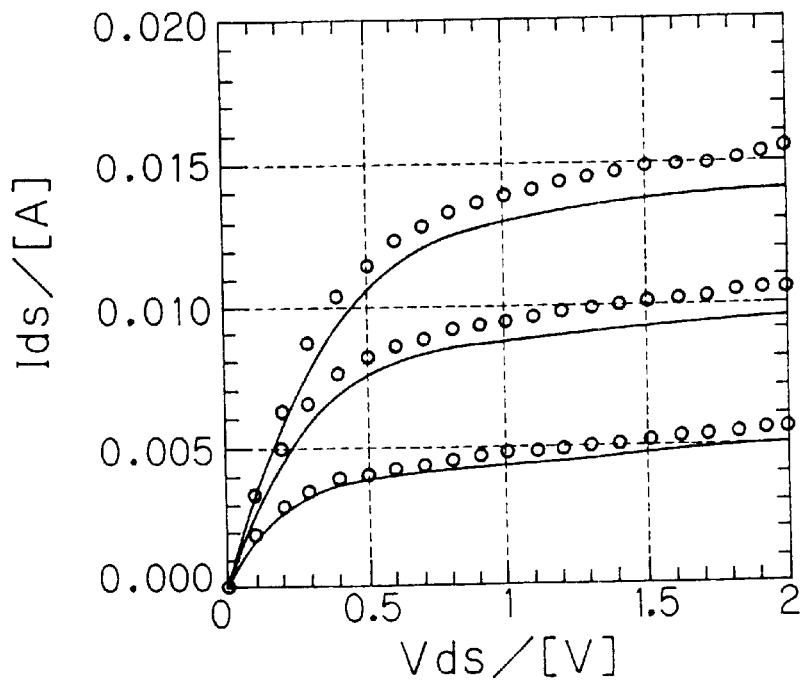

FIGS. 16 and 17 show measured values (white circles) of the best chip and results (curves) of simulation for the typical chip.

Figure 18:
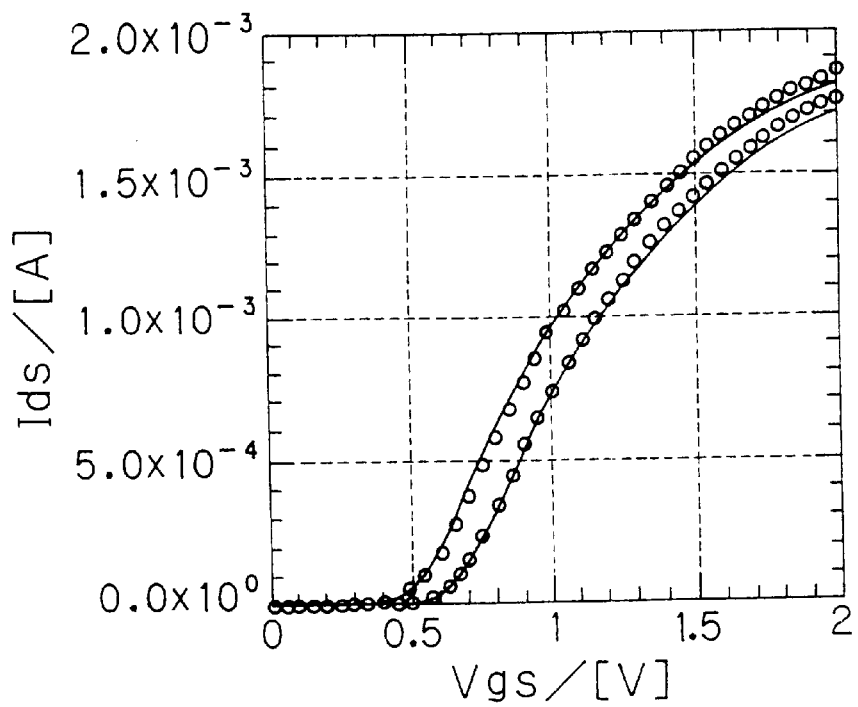
FIGS. 18 and 19 are graphs showing results of verification of the extraction methods according to the embodiment.
Figure 19:
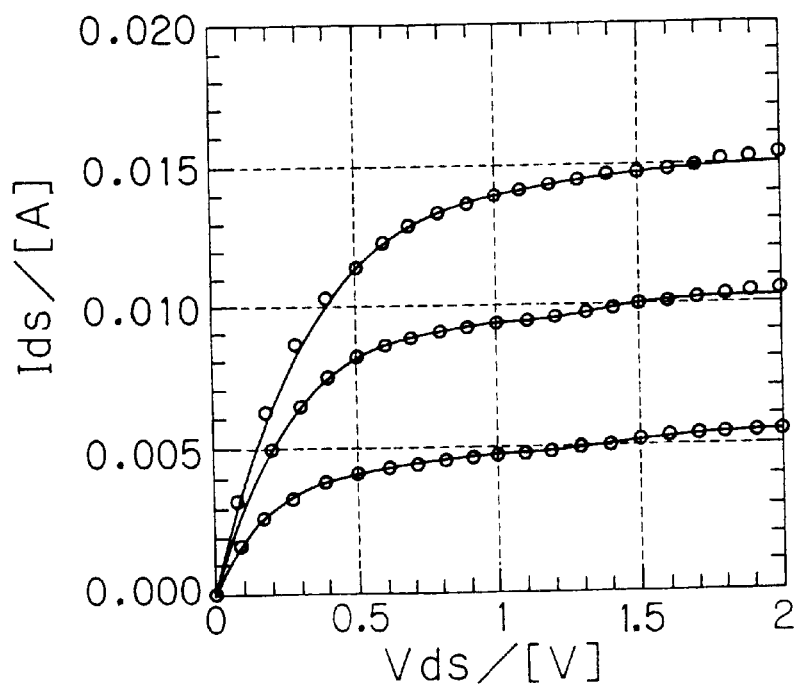

On the other hand, FIGS. 18 and 19 show measured values (white circles) of the best chip and results (curves) of simulation for the best chip obtained by reflecting difference between the E-T data of the best chip and the typical chip on the parameters Lint, Wint, Vth0, U0, Rds and Vsat in the aforementioned method. FIGS. 18 and 19 show that the results of simulation precisely match with the measurement results for the best chip with average errors of 1 to 2%.

Figure 20:
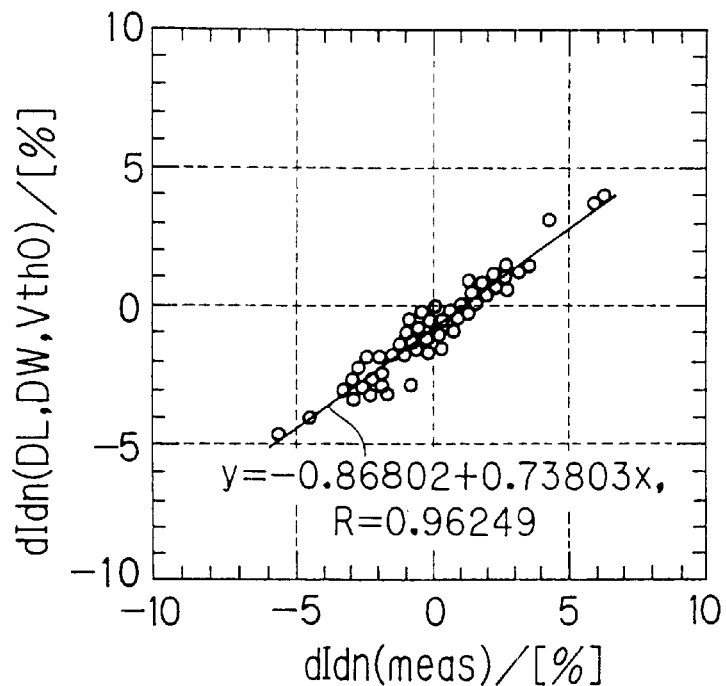
FIG. 20 is a graph compared with the extraction methods according to the embodiment.
Figure 21:
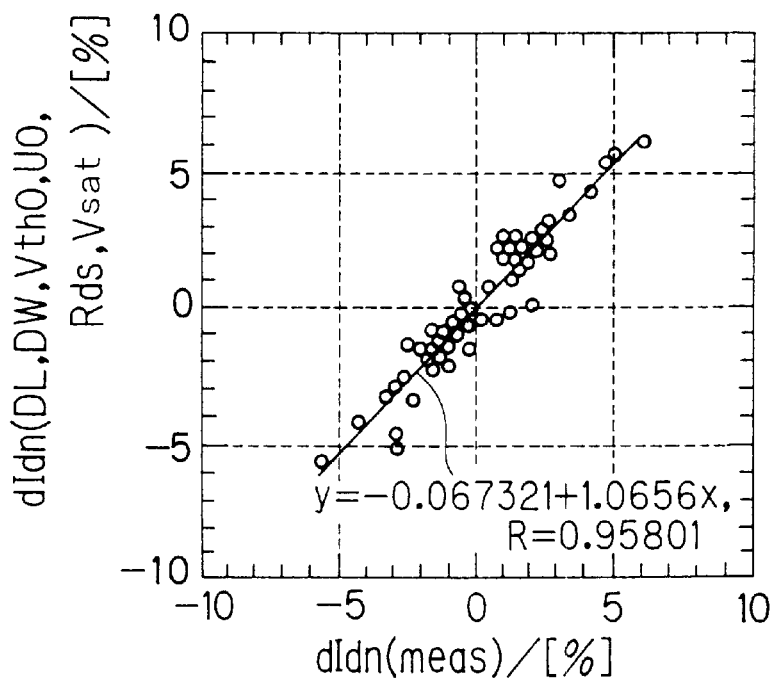
FIG. 21 is a graph showing results of verification of the extraction methods according to the embodiment.

In order to express dispersion of the drain-to-source current Ids of the NMOS transistor (short transistor) having the minimum channel length, dispersion of the parameter Vsat must be taken into consideration. This is because the NMOS transistor has higher drivability as compared with a PMOS transistor but is readily influenced by the drain electric field. FIGS. 20 and 21 are graphs showing the relation between values (vertical axes) obtained by simulation and measured values (transverse axis) in relation to the drain-to-source current Ids of the NMOS transistor in the case of Vds=Vgs=1.8 V and a substrate bias voltage Vbs=0.

In the simulation of FIG. 20, variously dispersed values are employed only for the parameters DL, DW and Vth0, while only typical values are given to the remaining parameters U0, Rds and Vsat. In other words, Ids is characterized with only the parameters DL, DW and Vth0 with no consideration of dispersion of Vsat in FIG. 20, while Ids is characterized with all parameters DL, DW, Vth0, U0, Rds and Vsat in consideration of dispersion of Vsat in the simulation of FIG. 21.

In the former case where Vsat is not taken into consideration with respect to dispersion of the drain-to-source current Ids, slope of a data point group is about 0.74, as shown on the straight line in FIG. 20. In the latter case where Vsat is taken into consideration with respect to dispersion of the drain-to-source current Ids, on the other hand, slope of the data point group is about 1.1, i.e., approximate to 1, as shown on the straight line in FIG. 21. In other words, FIGS. 20 and 21 indicate that simulation results precisely match with measured values due to consideration of Vsat with respect to dispersion of the drain-to-source current Ids.

4. Worst/Best Modeling

Figure 22:
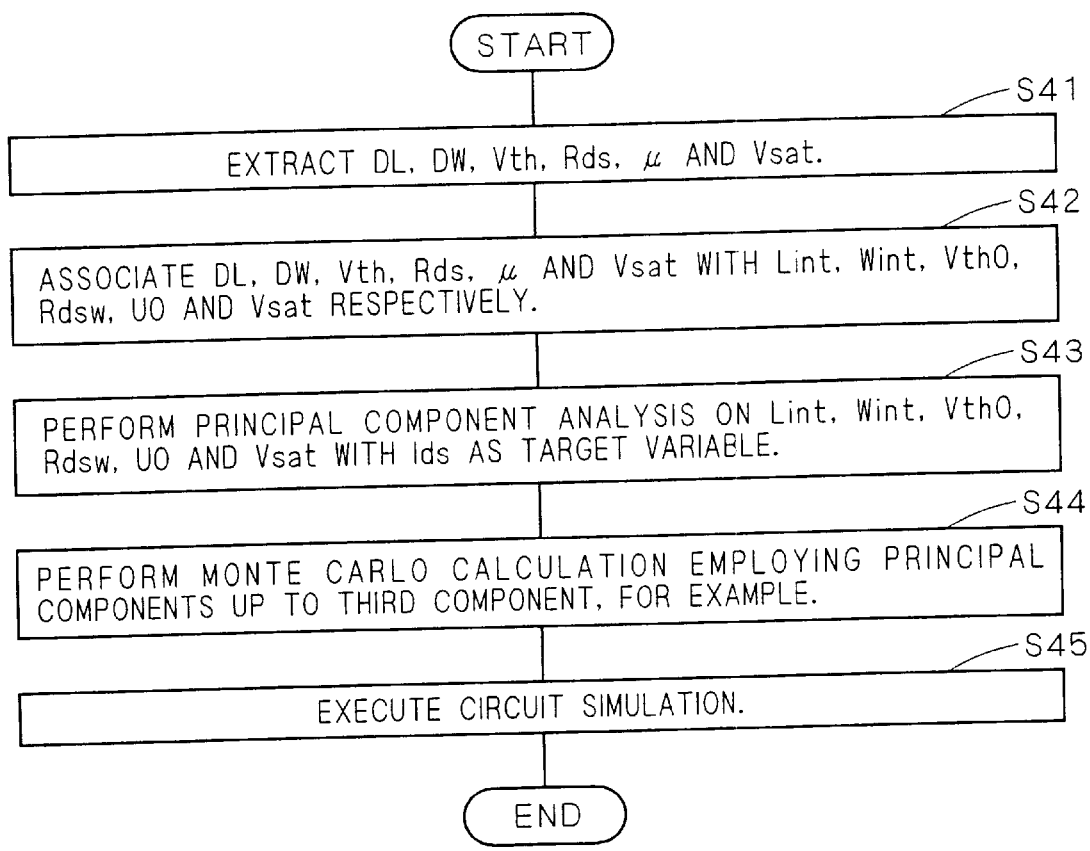
FIG. 22 is a flow chart of a characteristic evaluation method according to the embodiment.

A method of performing worst/best modeling based on the E-T data is now described. FIG. 22 is a flow chart showing the procedure of worst/best modeling according to this embodiment and circuit simulation based thereon. First, the E-T data DL, DW, Vth, Rds, $\mu$ and Vsat are extracted at a step S41. The E-T data are extracted from a plurality of MOS transistors having variously dispersed characteristics. Therefore, a plurality of sets of values are obtained as the E-T data. Then, the extracted E-T data are associated with the parameters Lint, Wint, Vth0, Rdsw, U0 and Vsat respectively at a step S42.

Then, at a step S43, principal component analysis is executed on the parameters Lint, Wint, Vth0, Rdsw, U0 and Vsat while regarding the drain-to-source current Ids as a target variable. The principal component analysis is a statistic technique for deriving a smaller number of independent variables hidden in a plurality of types of variables on the basis of a number of sets of values of plural types of variables mutually depending on one another, and this technique itself is well known. According to this embodiment, the principal component analysis is applied to the parameters Lint, Wint, Vth0, Rdsw, U0 and Vsat, for deriving independent variables correlating these parameters with one another.

At a subsequent step S44, Monte Carlo calculation is executed on the independent variables. In other words, random numbers are employed thereby providing variously dispersed values to the independent variables in a form such as normal distribution reflecting distribution of the characteristics of an actual element, for calculating the parameters Lint, Wint, Vth0, Rdsw, U0 and Vsat for each. In other words, variously dispersed values are provided to these parameters in a form reflecting dispersion of the actual element.

Thus, although the E-T data are extracted from a limited number of elements (MOS transistors) at the step S41, values of the parameters Lint, Wint, Vth0, Rdsw, U0 and Vsat for a by far larger number of elements are simulatively obtained at the step S44. In other words, precision of circuit simulation performed at a subsequent step S45 can be improved. While all independent variables may be selected to be provided with dispersion, partial independent variables such as first three variables among independent variables ordered along influence on the target variable Ids, i.e., first to third principal components may be regarded as the objects of Monte Carlo calculation, for example. Thus, calculation loads can be reduced.

At the subsequent step S45, circuit simulation is executed with reference to circuit connection information, in addition to the simulative parameters prepared at the step S44. Thus, characteristic data are obtained in consideration of dispersion of elements such as distribution of circuit delay times or distribution of the drain-to-source current Ids, for example.

As to the capacitance Cox of the gate insulator film OX, the thickness Tox may be set constant and dispersion of the thickness Tox may be forced into dispersion of the low electric field mobility U0, while the mobility R may be set constant and dispersion thereof may be forced into dispersion of the thickness Tox. This is because strong correlation is present between the thickness Tox and the low electric field mobility U0. FIG. 23 is a graph showing the relation between the capacitance Cox (=εox/Tox) and the low electric field mobility U0 obtained by measurement, and indicates that the correlation therebetween is strong.

5. Characteristic Extraction Device and Characteristic Evaluation Device

Exemplary structures of devices suitable for executing the aforementioned methods according to the embodiment are now described.

5.1. E-T Data Extraction Device

Figure 24:
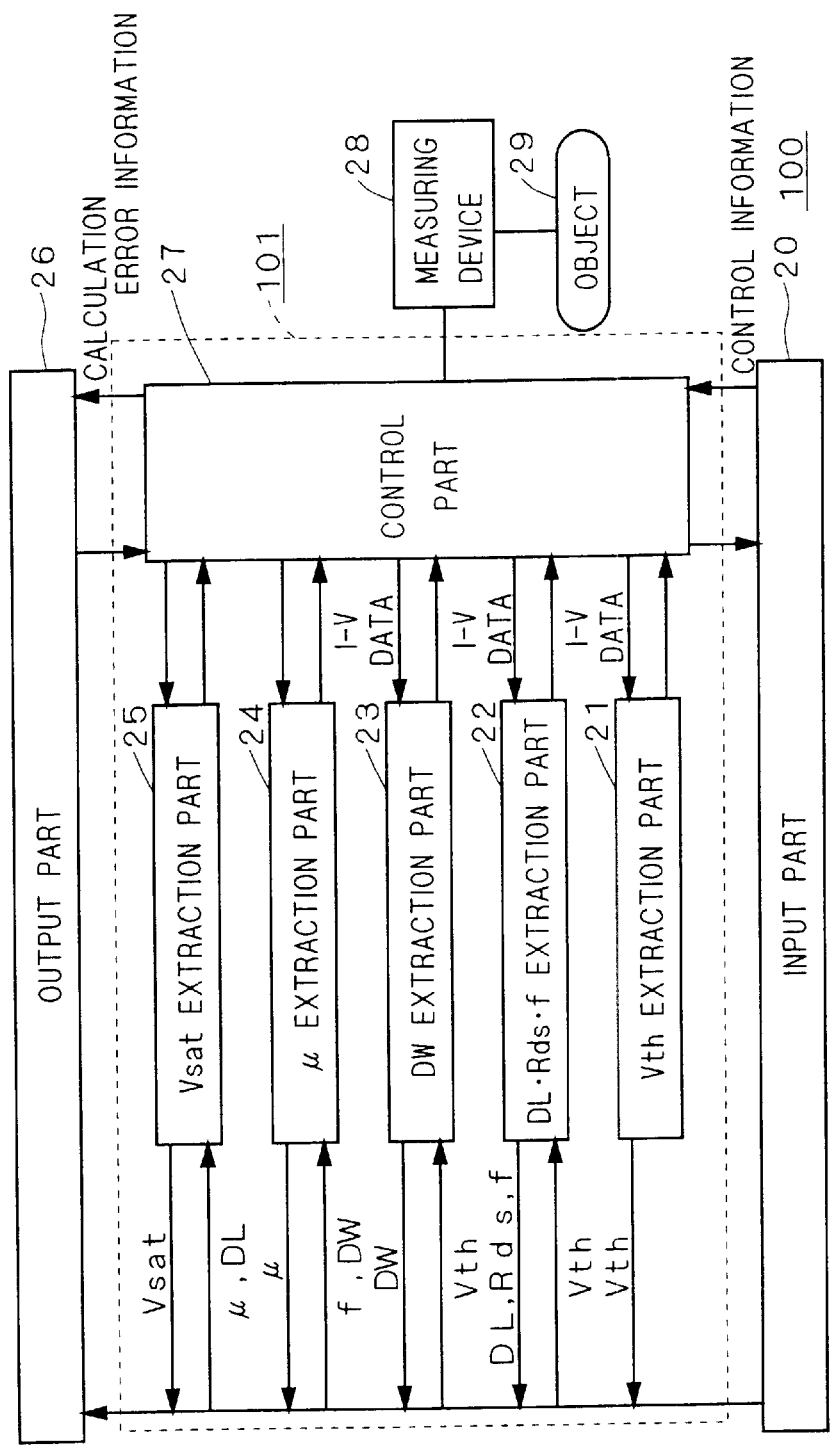
FIG. 24 is a block diagram of a characteristic extraction device according to the embodiment.

FIG. 24 is a block diagram showing a characteristic extraction device 100 according to the embodiment of the present invention. This device 100 extracts E-T data along the methods described with reference to the items 1. to 2. A measuring device 28 measures the characteristics of objects, i.e., MOS transistors loaded on a semiconductor chip or the like. A control part 27 controls respective device parts to operate in prescribed order on the basis of instructions (control information) of the operator input through an input part 20 having a keyboard, a mouse or the like. The measuring device 28 also performs measurement in a prescribed procedure under the control of the control part 27.

In block diagrams of FIGS. 24 to 29, arrows denote flow of signals such as data signals expressing data or control signals expressing instruction contents. For example, arrows for "I-V data" denote flow of signals expressing I-V data, and arrows for "$\mu$ data" denote flow of signals expressing $\mu$ data.

The measured data obtained by the measuring device 28 are supplied to a Vth extraction part 21, a DL·Rds·f extraction part 22, a DW extraction part 23, a $\mu$ extraction part 24 and a Vsat extraction part 25 through the control part 27. The Vth extraction part 21 extracts the threshold voltage Vth on the basis of Ids–Vgs characteristics obtained by measurement. The DL·Rds·f extraction part 22 extracts the channel shortening DL, the external resistance Rds and the factor f on the basis of the threshold voltage Vth extracted in the Vth extraction part 21 and the Ids–Vgs characteristics. The DW extraction part 23 extracts the channel narrowing DW on the basis of the threshold voltage Vth and the Ids–Vgs characteristics.

The $\mu$ extraction part 24 extracts the mobility $\mu$ on the basis of the factor f extracted in the DL·Rds·f extraction part 22 and the channel narrowing DW extracted in the DW extraction part 23. The Vsat extraction part 25 extracts the saturation velocity Vsat on the basis of the channel shortening DL extracted in the DL·Rds·f extraction part 22 and the mobility $\mu$ extracted in the R extraction part 24.

The extracted E-T data are output through an output part 26. When finding a calculation error, the control part 27 outputs information (calculation error information) thereof through the output part 26. The measuring device 28 may be formed not as part of the device 100 connected to a calculation part 101 executing calculation but as a separate device independent of the device 100. In other words, the measuring device 28 may be an external device for the device 100.

5.2. Characteristic Evaluation Device

Figure 25:
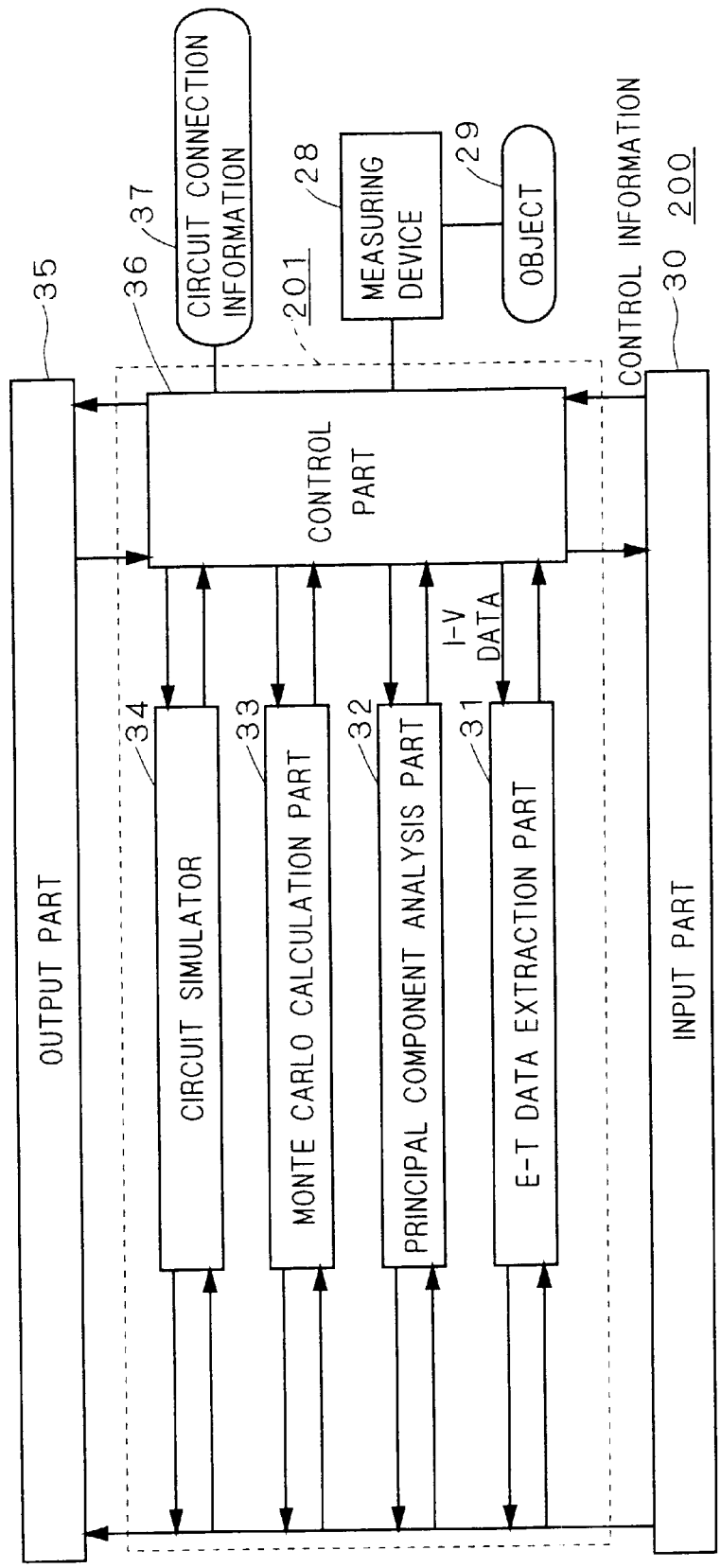
FIG. 25 is a block diagram of a characteristic evaluation device according to the embodiment.

FIG. 25 is a block diagram showing the structure of a characteristic evaluation device 200 according to this embodiment. This device 200 executes worst/best modeling and circuit simulation along the procedure shown in FIG. 22.

Part of a control part 36, part of an input part 30, an E-T data extraction part 31 and a measuring device 28 belong to the characteristic extraction device 100 shown in FIG. 24. The control part 36 controls respective device parts to operate in prescribed order on the basis of instructions (control information) of the operator input through the input part 30 having a keyboard, a mouse or the like. The measuring device 28 also performs measurement in prescribed order under control of the control part 36.

Measured data obtained by the measuring device 28 are supplied to the E-T data extraction part 31 through the control part 36. The E-T data extraction part 31, corresponding to the calculation part 101 of the device 100 (FIG. 24), extracts the E-T data. In other words, the E-T data extraction part 31 executes the processing of the step S41 in FIG. 22. A principal component analysis part 32 executes the processing of the steps S42 and S43 (FIG. 22) on the basis of the extracted E-T data. A Monte Carlo calculation part 33 executes the processing of the step S44 in FIG. 22. A circuit simulator 34 executes circuit simulation, i.e., the processing of the step S45 (FIG. 22) with reference to circuit connection information 37 input through the control part 36, in addition to the data transmitted from the Monte Carlo calculation part 33.

The results of the circuit simulation are output through an output part 35. When finding a calculation error, the control part 36 outputs information (calculation error information) thereof through the output part 35. The measuring device 28 may be formed not as part of the device 200 connected to a calculation part 201 executing calculation but as a separate device independent of the device 200. In other words, the measuring device 28 may be an external device for the device 200.

5.3. $\mu$ Extraction Device

Figure 26:
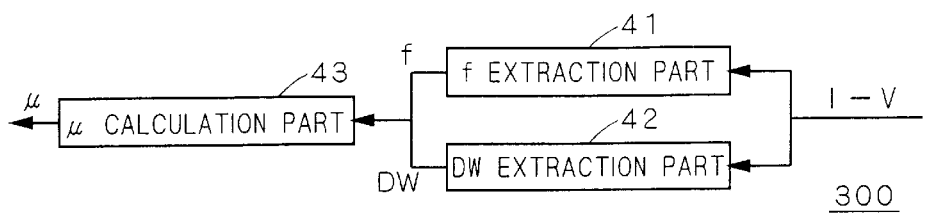
FIG. 26 is a block diagram of another characteristic evaluation device according to the embodiment.

FIG. 26 is a block diagram showing another exemplary characteristic extraction device according to the embodiment of the present invention. This device 300 is formed as a $\mu$ extraction device extracting the mobility $\mu$ along the procedure of FIG. 9. An f extraction part 41 executes the processing of the step S12 on the basis of the Ids–Vgs characteristics prepared at the step S11 of FIG. 9. Therefore, the f extraction part 41 can be formed as part of the DL·Rds·f extraction part 22 of FIG. 24.

A DW extraction part 42 executes the processing of the step S13 in FIG. 9. Therefore, the DW extraction part 42 can be formed equivalently to the DW extraction part 23 of FIG. 24. A $\mu$ calculation part 43 executes the processing of the step S14 in FIG. 9. Therefore, the $\mu$ calculation part 43 can be formed equivalently to the $\mu$ extraction part 24 of FIG. 24.

5.4. Velocity Saturation Effect Extraction Device

Figure 27:
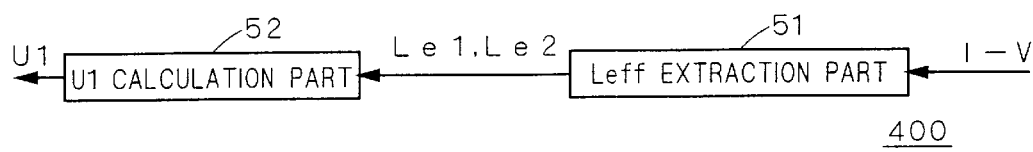
FIG. 27 is a block diagram of still another characteristic evaluation device according to the embodiment.

FIG. 27 is a block diagram showing another exemplary characteristic extraction device according to the embodiment of the present invention. This device 400 is formed as a velocity saturation effect extraction device extracting the velocity saturation coefficient U1 along the procedure of FIG. 12. A Leff extraction part 51 executes the processing of the step S22 of FIG. 12 and extracts effective channel lengths Le1 and Le2 on the basis of the Ids–Vgs characteristics prepared at the step S21. A U1 calculation part 52 executes the processing of the step S23 in FIG. 12 and outputs the velocity saturation coefficient U1.

Figure 28:
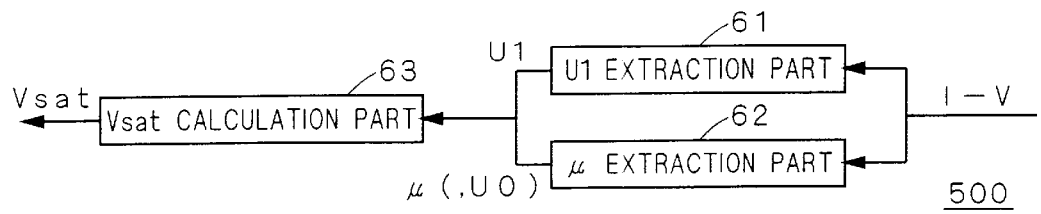
FIG. 28 is a block diagram of a further characteristic evaluation device according to the embodiment.

FIG. 28 is a block diagram showing a further exemplary characteristic extraction device according to the embodiment of the present invention. This device 500 is formed as a velocity saturation effect extraction device extracting the saturation velocity Vsat along the procedure of FIG. 14. A U1 extraction part 61 executes the processing at the step S31 of FIG. 14, and outputs the velocity saturation coefficient U1. A $\mu$ extraction part 62 executes the processing of the step S32 in FIG. 14, and outputs the mobility $\mu$ (or the low electric field mobility U0). A Vsat calculation part 63 executes the processing of the step S33 in FIG. 14, and outputs the saturation velocity Vsat.

6. Recording Medium

Figure 29:
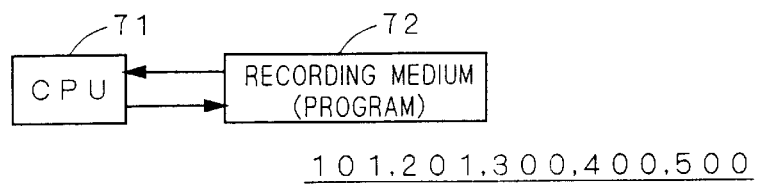
FIG. 29 is a block diagram of a characteristic extraction/evaluation device according to the embodiment.

Each of the calculation parts 101 and 201 and the devices 300, 400 and 500 shown in FIGS. 24 to 28 can be equivalently formed as a computer device having a computer 71 and a recording medium 72 storing a program defining operations of the computer 71, as shown in FIG. 29. A magnetic recording medium or a semiconductor memory can be employed as the recording medium 72, for example.

The program recorded in the recording medium 72 defines the procedure described in the above item 5. For example, the program recorded in the recording medium 72 provided in the calculation part 101 defines the procedure described in the above items 1 to 2., while the program recorded in the recording medium 72 provided in the calculation part 201 defines the procedure shown in FIG. 22. Further, the programs recorded in the recording media 72 provided in the devices 300, 400 and 500 defines the procedures shown in FIGS. 9, 12 and 14 respectively.

7. Semiconductor Device (1)

Figure 30:
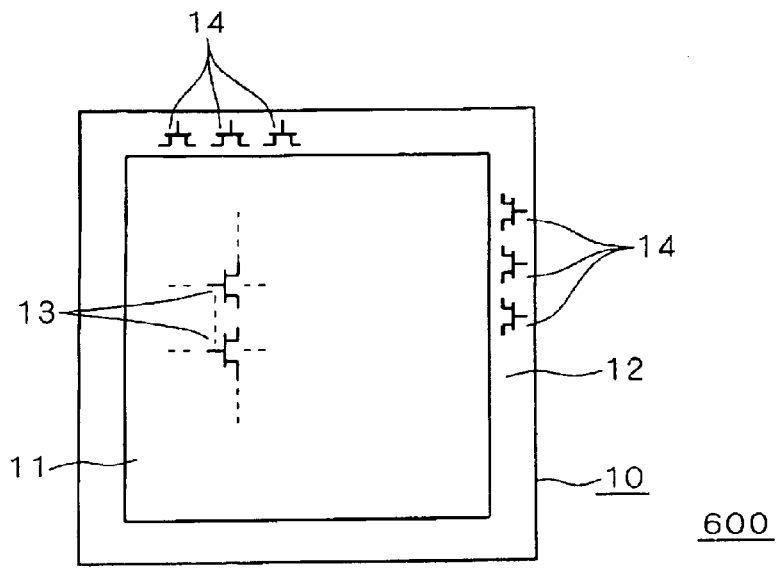
FIG. 30 is an element arrangement diagram of a semiconductor device according to the embodiment.
Figure 31:
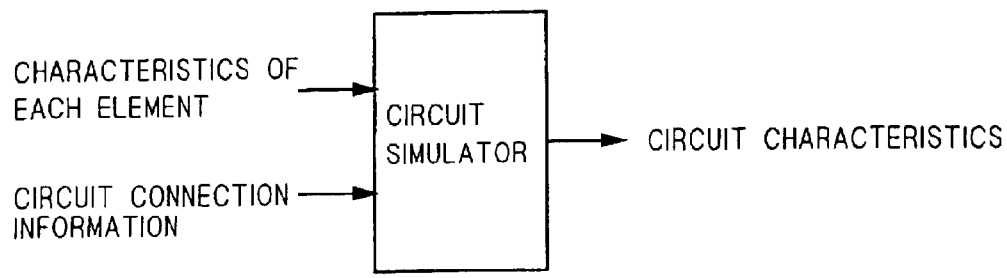
FIG. 31 is a schematic explanatory diagram of circuit simulation.

FIG. 30 is an element arrangement diagram schematically showing the structure of a semiconductor device 600 according to the embodiment of the present invention. In this semiconductor device 600, an integrated circuit 11 is formed in a single semiconductor chip (semiconductor substrate) 10. Further, MOS transistors 14 identical in design to MOS transistors included in the integrated circuit 11 except channel lengths and channel widths are formed in a monitor element region 12 set on the semiconductor chip 10 for monitoring in a form electrically isolated from the integrated circuit 11.

At least three MOS transistors 14 including at least two MOS transistors different only in channel length from each other and at least two MOS transistors different only in channel width from each other are prepared as the MOS transistors 14 for monitoring. Further, these MOS transistors 14 are set to satisfy the conditions described in the above item 2., i.e., the equations (19), (25), (30), (32) and (33).

Therefore, E-T data can be extracted with extraction errors less than an allowable value by employing the MOS transistors 14 representing the characteristics of the MOS transistors 13 included in the integrated circuit 11 as objects of measurement by the measuring device 28 (FIGS. 24 and 25). The monitor element region 12 is preferably arranged in the vicinity of the outer periphery of the semiconductor chip 10 not to hinder formation of the integrated circuit 11 while simplifying measurement, as shown in FIG. 30.

8. Semiconductor Device (2)

The characteristics of an integrated circuit (a circuit in general) provided on a semiconductor device can be evaluated by employing the methods of the embodiment described in the above items 1, to 2, and 4, or the devices according to the embodiment described in the above item 5., thereby verifying the characteristics of the integrated circuit or feeding back the characteristics to design or development in case of dissatisfaction. Thus, the semiconductor device can be smoothly completed to a product having guaranteed characteristics by performing characteristic evaluation employing the methods or the devices according to the embodiment in the process of manufacturing including design or development of the semiconductor device.

While the invention has been shown and described in detail, the foregoing description is in all aspects illustrative and not restrictive. It is therefore understood that numerous modifications and variations can be devised without departing from the scope of the invention.

What is claimed is:

1. A characteristic extraction device extracting a parameter expressing a velocity saturation effect of a MOS transistor, comprising:
   (a) an effective channel length extraction part receiving a signal expressing measured data of a characteristic of said MOS transistor and extracting an effective channel length of said MOS transistor for at least two drain-to-source voltages on the basis of said signal; and
   (b) a parameter calculation part calculating said parameter on the basis of extracted said effective channel length and outputting a signal expressing its value,
   wherein said parameter calculation part (b) includes:
   (b-1) a U1 calculation part calculating a velocity saturation coefficient U1 as said parameter expressing said velocity saturation effect by regarding said effective channel length as a function Le(Vds) of said drain-to-source voltages Vds and assuming the following relation with another parameter Leff:

$Le(Vds)=Leff+U1 \cdot Vds,$ wherein said at least two drain-to-source voltages are two drain-to-source voltages Vds1 and Vds2, and said U1 calculation part (b-1) includes:
   (b-1-1) a device part expressing a set of values Le(Vds1) and Le(Vds2) of said function calculated by using said relation for said two drain-to-source voltages Vds1 and Vds2, as a data point on a graph of at least two MOS transistors,
   (b-1-2) a device part expressing a group of said data points in a straight line on said graph, and
   (b-1-3) a device part obtaining said velocity saturation coefficient U1 by dividing said value Le(Vds2) at said value Le(Vds1) being about zero on said straight line by the difference Vds2−Vds1 between said voltage Vds1 and said voltage Vds2.

2. A characteristic extraction device extracting a parameter expressing a velocity saturation effect of a MOS transistor, comprising:
   (a) an effective channel length extraction part receiving a signal expressing measured data of a characteristic of said MOS transistor and extracting an effective channel length of said MOS transistor for at least two drain-to-source voltages on the basis of said signal; and (b) a parameter calculation part calculating said parameter on the basis of extracted said effective channel length and outputting a signal expressing its value, wherein said parameter calculation part (b) includes:

(b-1) a U1 calculation part calculating a velocity saturation coefficient U1 as said parameter expressing said velocity saturation effect by regarding said effective channel length as a function Le(Vds) of said drain-to-source voltages Vds and assuming the following relation with another parameter Leff:

$$Le(Vds)=Leff+U1 \cdot Vds,$$

wherein said at least two drain-to-source voltages are two drain-to-source voltages Vds1 and Vds2, and said U1 calculation part (b-1) includes:

(b-1-1) a device part expressing a set of a ratio Le(Vds2)/Le(Vds1) and an inverse 1/Le(Vds1) obtained from values Le(Vds1) and Le(Vds2) of said function calculated by using said relation for said two drain-to-source voltage Vds1 and Vds2, as a data point on a graph of at least two MOS transistors, (b-1-2) a device part expressing a group of said data points in a straight line on said graph, and (b-1-3) a device part obtaining said velocity saturation coefficient U1 by dividing a slope of said straight line by the difference Vds2−Vds1 between said voltage Vds1 and said voltage Vds2.

3. A characteristic extraction device extracting a parameter expressing a velocity saturation effect of a MOS transistor, comprising:

(a) an effective channel length extraction art receiving a signal expressing measured data of a characteristic of said MOS transistor and extracting an effective channel length of said MOS transistor for at least two drain-to-source voltage on the basis of said signal; and (b) a parameter calculation part calculating said parameter on the basis of extracted said effective channel length and outputting a signal expressing its value, (c) an f extraction part receiving signals expressing measured data of characteristics of at least two MOS transistors different only in channel length from each other and extracting channel resistance f(Vgt) per unit effective channel length as a function of a gate overdrive Vgt on the basis of said signals, (d) a DW extraction part receiving signals of measured data of characteristics of at least two MOS transistors different only in channel width from each other and extracting channel narrowing DW(Vgt) as a function of said gate overdrive Vgt on the basis of said signals, (e) a μ calculation part deciding said parameter so as to fit mobility μ (Vgt) as a function of said gate overdrive Vgt expressed by the following relations employing a capacitance Cox of a gate insulator film, a drain-to-source voltage Vds and a channel width Wm:

$$\frac{1}{\mu(Vgt)} = h(Vgt) \cdot Cox \cdot \left(Vgt - \frac{Vds}{2}\right)$$

and $$h(Vgt) = f(Vgt) \cdot (Wm - Dw(Vgt)), \text{ and}$$

(f) a Vsat calculation part calculating a saturation velocity given by a function of said velocity saturation coefficient U1 calculated in said U1 calculation part (b-1) and said parameter decided in said μ calculation part (e) as a parameter expressing said velocity saturation effect and outputting a signal expressing the value thereof, wherein said parameter calculation part (b) includes:

(b-1) a U1 calculation part calculating a velocity saturation coefficient U1 as said parameter expressing said velocity saturation effect by regarding said effective channel length as a function Le(Vds) of said drain-to-source voltages Vds and assuming the following relation with another parameter Leff:

$$Le(Vds)=Leff+U1 \cdot Vds.$$

4. A characteristic extraction device extracting a parameter expressing mobility of a MOS transistor, comprising:

(a) an f extraction part receiving first signals expressing measured data of characteristics of at least two MOS transistors different only in channel length from each other and extracting channel resistance f(Vgt) per unit effective channel length as a function of a gate overdrive Vgt on the basis of said first signals, wherein said f extraction part includes:

(a-1) a device part obtaining data related to drain-to-source current Ids vs. gate-to-source voltage Vgs as to each of said at least two MOS transistors different only in said channel length from each other, (a-2) a device part expressing a set of total resistance defined as Vds/Ids and said channel length for each of said at least two MOS transistors different only in said channel length from each other and each of at least two gate overdrives Vgt as a data point on a graph, (a-3) a device part individually expressing each group of said data points having said gate overdrive Vgt in common in a straight line, and (g-4) a device part calculating channel resistance f(Vgt) per said unit effective channel length as a function of said gate overdrives Vgt from slopes of said straight lines corresponding to said at least two gate overdrives Vgt respectively;

(b) a DW extraction part receiving second signals expressing measured data of characteristics of at least two MOS transistors different only in channel width from each other and extracting channel narrowing DW(Vgt) as a function of said gate overdrive Vgt on the basis of said second signals; and (c) a μ calculation part deciding said parameter to fit mobility μ (Vgt) as a function of said gate overdrive Vgt expressed by the following relations with a capacitance Cox of a gate insulator film, a drain-to-source voltage Vds and a channel width Wm and outputting a signal expressing the value thereof:

$$\frac{1}{\mu(Vgt)} = h(Vgt) \cdot Cox \cdot \left(Vgt - \frac{Vds}{2}\right)$$

and $$h(Vgt) = f(Vgt) \cdot (Wm - DW(Vgt)).$$

5. The characteristic extraction device according to claim 4, wherein said DW extraction part (b) includes:

(b-1) a device part obtaining data related to drain-to-source current Ids vs. gate-to-source voltage Vgs as to each of said at least two MOS transistors different only in said channel width from each other, (b-2) a device part expressing a s t of conductance defined as Ids/Vds or said drain-to-source current Ids itself and said channel width for each of said at least two MOS transistors different only in said channel width from each other and each of at least two gate overdrives Vgt as a data point on a graph, (b-3) a device part individually expressing each group of said data points having said gate overdrive Vgt in common in a straight line, and (b-4) a device part calculating said channel narrowing DW(Vgt) as a function of said gate overdrives Vgt from intercepts of a coordinate axis, expressing said channel width, of said straight lines corresponding to said at least two gate overdrives Vts respectively.

6. A characteristic evaluation device evaluating characteristics of a circuit having a MOS transistor, comprising:

(1) an E-T data extraction part, extracting E-T data of said MOS transistor, including (1-1) the characteristic extraction device extracting a parameter expressing a velocity saturation effect of said MOS transistor, comprising:

(a1) an effective channel length extraction part receiving a signal expressing measured data of a characteristic of said MOS transistor and extracting an effective channel length of said MOS transistor for at least two drain-to-source voltages on the basis of said signal; and (b1) a parameter calculation part calculating said parameter on the basis of extracted said effective channel length and outputting a signal expressing its value, and (1-2) the characteristic extraction device extracting a parameter expressing mobility of said MOS transistor, comprising:

(a2) an f extraction part receiving signals expressing measured data of characteristics of at least two MOS transistors different only in channel length from each other and extracting channel resistance f(Vgt) per unit effective channel length as a function of a gate overdrive Vgt on the basis of said signal;

(b2) a DW extraction part receiving signals expressing measured data of characteristics of at least two MOS transistors different only in channel width from each other and extracting channel narrowing DW(Vgt) as a function of said gate overdrive Vgt on the basis of said signals; and (c2) a $\mu$ calculation part deciding said parameter to fit mobility $\mu$ (Vgt) as a function of said gate overdrive Vgt expressed by the following relations employing a capacitance Cox of a gate insulator film, a drain-to-source voltage Vds and a channel width Wm and outputting a signal expressing the value thereof:

$$\frac{1}{\mu(Vgt)} = h(Vgt) \cdot Cox \cdot \left(Vgt - \frac{Vds}{2}\right)$$

and $$h(Vgt) = f(Vgt) \cdot (Wm - DW(Vgt));$$

(2) a principal component analysis part extracting independent variables by executing principal component analysis on said E-T data extracted in said E-T data extraction part (1);

(3) a Monte Carlo calculation part supplying statistical dispersion to said E-T data by supplying statistical dispersion to at least part of said independent variables; and (4) a circuit simulator receiving signal expressing statistically dispersed said E-T data obtained in said Monte Carlo calculation part (3) and a signal expressing circuit connection information being information related to connection conditions between elements forming said circuit and executing circuit simulation related to said circuit.

* * * * *